(12) United States Patent
Utagawa et al.

(10) Patent No.: US 9,225,057 B2
(45) Date of Patent: Dec. 29, 2015

(54) ANTENNA APPARATUS AND WIRELESS COMMUNICATION DEVICE USING SAME

(75) Inventors: Naoaki Utagawa, Tokyo (JP); Manabu Kitami, Tokyo (JP); Masaki Matsushima, Tokyo (JP); Takeshi Oohashi, Tokyo (JP); Yasumasa Harihara, Tokyo (JP)

(73) Assignee: TDK CORPORATION, Tokyo (JP)

( * ) Notice: Subject to any disclaimer, the term of this patent is extended or adjusted under 35 U.S.C. 154(b) by 482 days.

(21) Appl. No.: 13/637,836

(22) PCT Filed: Mar. 30, 2011

(86) PCT No.: PCT/JP2011/057961
§ 371 (c)(1),
(2), (4) Date: Dec. 10, 2012

(87) PCT Pub. No.: WO2011/125707
PCT Pub. Date: Oct. 13, 2011

(65) Prior Publication Data
US 2013/0088398 A1  Apr. 11, 2013

(30) Foreign Application Priority Data
Apr. 1, 2010  (JP) ................................ 2010-085543

(51) Int. Cl.
*H01Q 9/30* (2006.01)
*H01Q 1/38* (2006.01)
*H05K 1/02* (2006.01)

(52) U.S. Cl.
CPC ............... *H01Q 1/38* (2013.01); *H05K 1/0243* (2013.01); *H05K 2201/10098* (2013.01)

(58) Field of Classification Search
CPC .................. H01Q 1/38; H05K 1/0243; H05K 2201/10098
See application file for complete search history.

(56) References Cited

U.S. PATENT DOCUMENTS

| 6,940,458 B2 | 9/2005 | Mukai et al. |
| 2004/0125032 A1 | 7/2004 | Ikuta et al. |

(Continued)

FOREIGN PATENT DOCUMENTS

| CN | 1510781 A | 7/2004 |
| GB | 2 439 863 A | 1/2008 |

(Continued)

OTHER PUBLICATIONS

International Search Report issued in International Application No. PCT/JP2011/057961 mailed Jul. 5, 2011.

(Continued)

*Primary Examiner* — Trinh Dinh
(74) *Attorney, Agent, or Firm* — McDermott Will & Emery LLP

(57) ABSTRACT

An antenna device includes an antenna element 10 and a printed circuit board 20 on which the antenna element 10 is mounted. The antenna element 10 includes a base 11 which is made of a dielectric material and a radiation conductor formed on at least one surface of the base 11. The printed circuit board 20 includes ground clearance region 23a having substantially a rectangular shape and having one side contacting an edge of the printed circuit board and other three sides surrounded by an edge line of a ground pattern, an antenna mounting region 27 provided within the ground clearance region 23a, and at least one frequency adjusting element 30 provided within the ground clearance region 27. The frequency adjusting element 30 is provided on the far side of the antenna mounting region 27 as viewed from an edge 20e of the printed circuit board 20.

11 Claims, 24 Drawing Sheets

(56) References Cited

U.S. PATENT DOCUMENTS

| | | |
|---|---|---|
| 2004/0183733 A1 | 9/2004 | Aoyama et al. |
| 2009/0079651 A1* | 3/2009 | Shibata et al. ............... 343/787 |
| 2010/0103057 A1* | 4/2010 | Harihara et al. ............. 343/702 |
| 2010/0127940 A1* | 5/2010 | Harihara et al. ....... 343/700 MS |
| 2010/0220030 A1* | 9/2010 | Shimoda et al. ............. 343/860 |
| 2010/0225542 A1* | 9/2010 | Suzuki et al. .......... 343/700 MS |
| 2010/0309060 A1* | 12/2010 | Harihara ................ 343/700 MS |
| 2011/0001672 A1 | 1/2011 | Harihara |

FOREIGN PATENT DOCUMENTS

| | | |
|---|---|---|
| JP | 2004-194211 A | 7/2004 |
| JP | 2004-282109 A | 10/2004 |
| JP | 2004-304783 A | 10/2004 |
| JP | 2005-236534 A | 9/2005 |
| JP | 4103936 B2 | 6/2008 |
| JP | 2008-252158 A | 10/2008 |
| JP | 2009-147617 A | 7/2009 |
| WO | WO-2006/120763 A1 | 11/2006 |
| WO | WO-2009/081803 A1 | 7/2009 |

OTHER PUBLICATIONS

English Translation of the Written Opinion (PCT/ISA/237) issued in International Application No. PCT/JP2011/057961 mailed Jul. 5, 2011.

* cited by examiner

ANTENNA APPARATUS AND WIRELESS COMMUNICATION DEVICE USING SAME

TECHNICAL FIELD

The present invention relates to an antenna device and a wireless communication device using the antenna device and, more particularly, to a technique for adjusting antenna characteristics.

BACKGROUND ART

In recent years, a chip antenna for Bluetooth® or GPS is incorporated in a small mobile terminal such as a mobile phone. The chip antenna of such a type is required to be small in size and easily be adjusted in terms of a resonance frequency thereof and advantageous in terms of impedance matching. This is because the resonance frequency and an input impedance of the chip antenna vary due to influences of a structure of a printed circuit board, various electronic components mounted around the chip antenna, and a casing, and thus, it is necessary to adjust the resonance frequency and input impedance for each model.

As a method of adjusting the resonance frequency and input impedance, there is known a method described in, e.g., Patent Document 1, in which a chip component such as a chip capacitor or a chip inductor is used. Further, Patent Documents 2 and 3 propose a frequency variable circuit using a varicap diode as a method of adjusting the resonance frequency.

CITATION LIST

[Patent Document]
[Patent Document 1] Japanese Patent Application Laid-Open No. H10-013138
[Patent Document 2] International Publication No. WO2006-134701
[Patent Document 3] International Publication No. WO2009-028251

SUMMARY OF THE INVENTION

Problems to be Solved

However, when a commercially available JIS standardized chip component is used, it is necessary to select one having a value close to a target value as possible from the chip components having element values set at constant intervals. That is, the resonance frequency significantly varies due to a slight difference in the element value, which complicates subsequent fine adjustment. Further, in a case where the above-mentioned frequency variable circuit using the varicap diode is employed, a power supply voltage for the circuit to operate is required, leading to an increase in power consumption.

The present invention has been made in view of the above problems, and a main object thereof is to realize an antenna device which is easily adjusted in terms of a resonance frequency thereof and easily manufactured. Another object of the present invention is to provide a wireless communication device achieved using such an antenna device.

Means of Solving the Problems

To solve the above problems, an antenna device comprises: an antenna element; and a printed circuit board on which the antenna element is mounted, wherein the antenna element includes: a base which is made of a dielectric material; and a radiation conductor formed on at least one surface of the base, the printed circuit board includes: a ground clearance region having substantially a rectangular shape and having one side contacting an edge of the printed circuit board and other three sides surrounded by an edge line of a ground pattern, an antenna mounting region provided within the ground clearance region, at least one frequency adjusting element provided within the ground clearance region, and the frequency adjusting element includes a chip capacitor or a chip inductor provided on the far side of the antenna mounting region as viewed from the edge of the printed circuit board.

A wireless communication device according to the present invention comprises a communication circuit and the antenna device according to the present invention, wherein the communication circuit is mounted on the printed circuit board.

In the present invention, the edge line of the ground pattern has a first edge line orthogonal to the edge of the printed circuit board, a second edge line opposed to the edge of the printed circuit board, and a third edge line opposed to the first edge line, and a distance between the frequency adjusting element and second edge line is smaller than a distance between the frequency adjusting element and antenna mounting region. With this configuration, the frequency adjusting element is spaced far from the antenna element, so that it is possible to reduce electromagnetic coupling between the frequency adjusting element and antenna element, thereby preventing an excessive change in a resonance frequency associated with a change in value of the frequency adjusting element.

In the present invention, it is preferable that the frequency adjusting element within the ground clearance region is provided on the near side of the first edge line or third edge line. With this configuration, it is possible to reduce a change rate of the resonance frequency with respect to a change of the frequency adjusting element as compared to a case where the frequency adjusting element is provided at the width direction center of the ground clearance region.

In the present invention, it is preferable that one end and the other end of the frequency adjusting element are each connected to any of the first to third edge lines. With this configuration, it is possible to reduce a change rate of the resonance frequency with respect to a change of the frequency adjusting element as compared to a case where the frequency adjusting element is grounded through a terminal electrode.

In the present invention, it is preferable that the one end of the frequency adjusting element is connected to the first edge line through a first wiring pattern and that the other end of the frequency adjusting element is connected to the second edge line through a second wiring pattern. With this configuration, a connection pattern of the frequency adjusting element assumes an L-shape, thereby further reducing the change rate of the resonance frequency.

It is preferable that the antenna device according to the present invention further includes first and second electrode patterns sandwiched between a bottom surface of the base and the printed circuit board, wherein the first electrode pattern is connected to the ground pattern, and the second electrode pattern is connected to a power feeding line. In this case, the first and second electrode patterns may include an antenna element side terminal electrode, a printed circuit board side land patterns, or both of them. Preferably, the first and second electrode patterns may include the antenna element side terminal electrode. A configuration may be possible in which the electrode patterns are formed only on the printed circuit board and the electrode pattern on the bottom surface of the base of the antenna element are omitted. However, in a case where the first and second terminal electrodes are formed on the bottom surface of the base, a variation in characteristics due to displacement of the position of base with respect to the printed circuit board can be reduced.

In the present invention, it is preferable that the printed circuit board further includes first and second lands provided within the antenna mounting region in correspondence with the first and second terminal electrodes, respectively, the first terminal electrode is connected to the ground pattern through the first lands, and the second terminal electrode is connected to the power feeding line through the second lands. According to the present invention, the antenna element can be solder-mounted to reliably connect the first land and first terminal electrode to each other and the second terminal electrode and power feeding line to each other.

In the present invention, it is preferable that the antenna element further includes a third terminal electrode formed on the bottom surface of the base, the printed circuit board further includes a third land provided within the antenna mounting region in correspondence with the third terminal electrode, and the third terminal electrode is connected to the ground pattern through the third land. In this case, it is particularly preferable that at least one of the third terminal electrode and third land is formed into an L-shape having an open end facing the edge side of the printed circuit board. An electric field contributing to radiation tends to be well distributed around a leading end of an electrode. Radiation resistance increases and radio waves are easily radiated by making the open end of the electrode face the edge side of the printed circuit board to thereby facilitate. This can reduce electromagnetic coupling between the open end (leading end) and ground pattern, thereby improving radiation efficiency.

In the present invention, it is preferable that the conductor patterns formed on the surfaces of the base of the antenna element has a symmetrical configuration with respect to a center line of the base extending in a longitudinal direction thereof. With this configuration, even when a direction of the antenna element is rotated by 180° about an axis (Z-axis) orthogonal to upper and lower surfaces of the base, the conductor pattern shape of the antenna element as viewed from the edge side of the printed circuit board does not change substantially. Therefore, the antenna characteristics do not significantly change due to the direction of the antenna element, facilitating antenna design.

Effect of the Invention

According to the present invention, it is possible to provide an antenna device capable of facilitating fine adjustment of the resonance frequency even if a commercially available chip component is used. Further, according to the present invention, it is possible to provide a high performance wireless communication device constructed using such an antenna device.

DETAILED DESCRIPTION OF THE EMBODIMENTS

Preferred embodiments of the present invention will be described in detail hereinafter with reference to the accompanying drawings.

Figure 1:
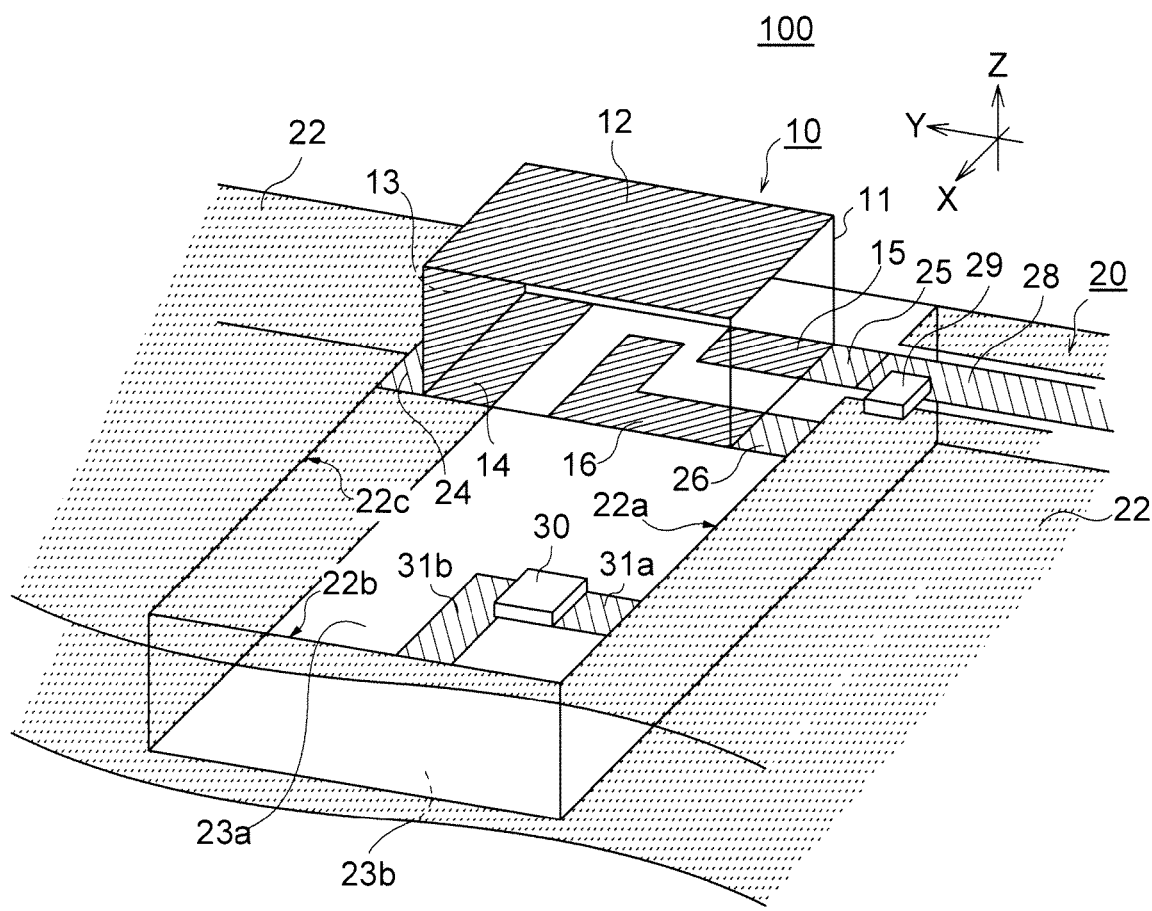
FIG. 1 is a schematic perspective view illustrating a configuration of an antenna device 100 according to a first embodiment of the present invention.
Figure 2:
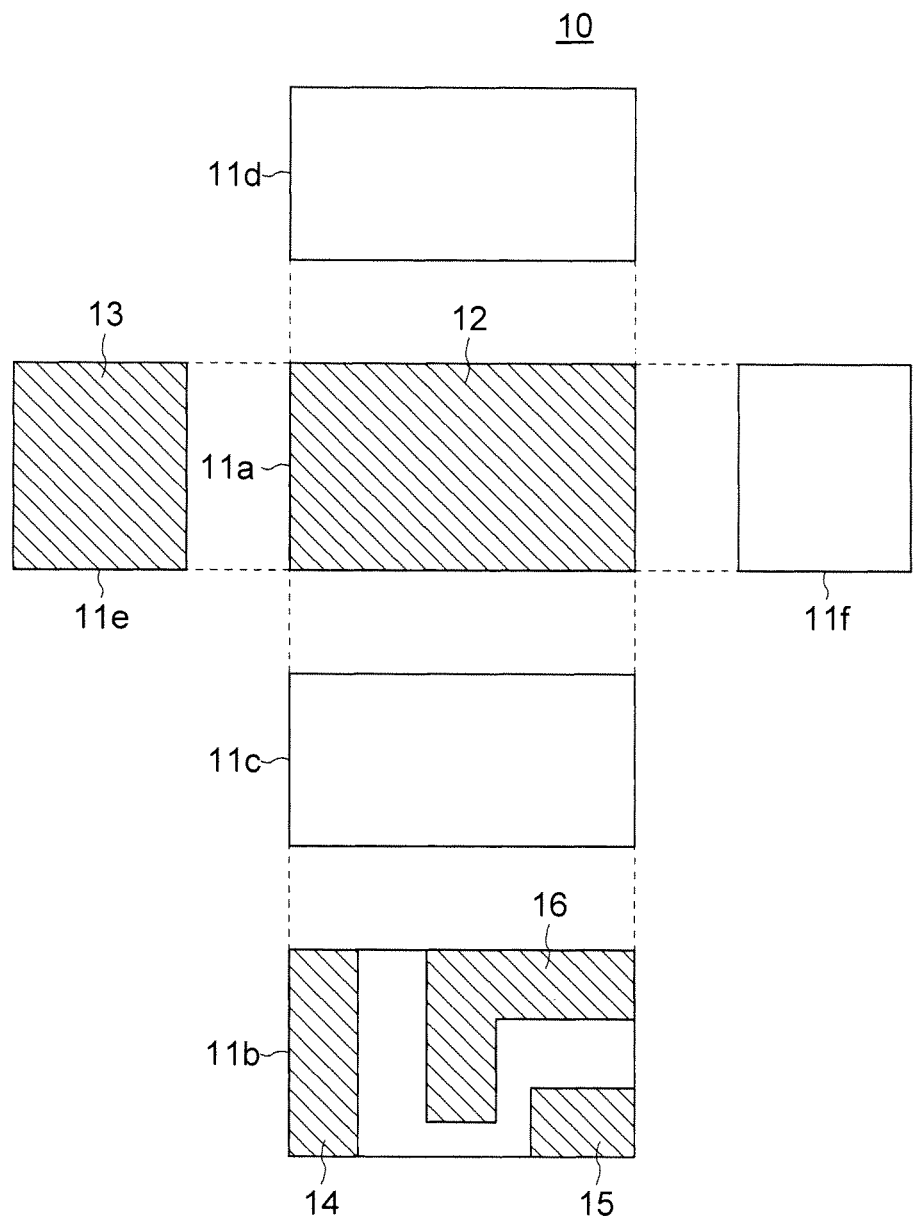
FIG. 2 is a developed view of the antenna element 10.

FIG. 1 is a schematic perspective view illustrating a configuration of an antenna device 100 according to a first embodiment of the present invention. FIG. 2 is a developed view of the antenna element 10.

As illustrated in FIG. 1, the antenna device 100 according to the present embodiment includes an antenna element 10 and a printed circuit board 20 on which the antenna element 10 is mounted.

The antenna element 10 is constituted by a base 11 made of a dielectric material and a plurality of conductor patterns formed on the base 11. The base 11 has a rectangular solid shape elongated in a Y-direction. An upper surface 11a, a bottom surface 11b, and two side surfaces 11c and 11d of the base 11 are surfaces parallel to the Y-direction, and side surfaces 11e and 11f thereof are surfaces orthogonal to the Y-direction. The bottom surface 11b is a mounting surface with respect to the printed circuit board 20. A vertical direction of the antenna element 10 is defined with respect to a front surface of the printed circuit board 20.

A size of the base 11 is preferably as small as possible within a range in which desired radiation efficiency can be ensured and may be set to, e.g., 2.0×1.25×0.8 (mm). As for the material for the base 11, although not limited to, a Ba—Nd—Ti based material (relative permittivity of 80 to 120), an Nd—Al—Ca—Ti based material (relative permittivity of 43 to 46), an Li—Al—Sr—Ti based material (relative permittivity of 38 to 41), a Ba—Ti based material (relative permittivity of 34 to 36), a Ba—Mg—W based material (relative permittivity of 20 to 22), an Mg—Ca—Ti based material (relative permittivity of 19 to 21), sapphire (relative permittivity of 9 to 10), alumina ceramics (relative permittivity of 9 to 10), and cordierite ceramics (relative permittivity of 4 to 6) may be used. The base 11 is manufactured by sintering these materials using a mold form.

The dielectric material can be selected appropriately according to a target frequency. As the relative permittivity $\in_r$ increases, a larger wavelength shortening effect can be obtained. Thus, the length of a radiation conductor can be shortened. However, because the radiation efficiency decreases as the relative permittivity $\in_r$ increases, it does not necessarily mean that the larger relative permittivity $\in_r$ is preferable, but there exists a proper value for the relative permittivity $\in_r$. For example, when the target frequency is 2.4 GHz, it is preferable to use a material having the relative permittivity $\in_r$ of about 5 to 100. By using such a material, it is possible to downsize the base while securing sufficient radiation efficiency. The material having the relative permittivity $\in_r$ of about 5 to 100 preferably includes Mg—Ca—Ti based dielectric ceramics. It is particularly preferable to use Mg—Ca—Ti based dielectric ceramics containing $TiO_2$, MgO, CaO, MnO, and $SiO_2$.

As illustrated in FIG. 2, the conductor patterns of the antenna element 10 include an upper surface conductor pattern 12 formed on the upper surface 11a of the base 11, a side surface conductor pattern 13 formed on the side surface 11e thereof, and first to third terminal electrodes 14 to 16 formed on the bottom surface 11b thereof. These conductor patterns may be formed by applying an electrode paste material using a method such as screen printing and transferring and then baking the applied electrode paste material under a predetermined temperature condition. Silver, silver-palladium, silver-platinum, copper and the like may be used as the electrode paste material. It is also possible to form the conductor patterns by using plating, sputtering and the like.

The upper surface conductor pattern 12 is a part that contributes most to radio emission and is formed on substantially the entire area of the upper surface 11a of the base 11. Although the upper surface conductor pattern 12 need not always be formed on the entire surface, the larger the area of the upper surface conductor pattern 12, the higher radiation efficiency can be. One end of the upper surface conductor pattern 12 in a longitudinal direction is opened but is substantially capacitively-coupled to the second and third terminal electrodes 15 and 16. The other end of the upper surface conductor pattern 12 in the longitudinal direction is connected to the first terminal electrode 14 through the side surface conductor pattern 13, and whereby the upper surface conductor pattern 12, side surface conductor pattern 13, and first terminal electrode 14 constitute one continuous radiation conductor. Since the radiation conductor is formed over a plurality of surfaces of the base 11 as described above, a desired electrical length can be ensured even if the size of the base 11 is reduced.

The first to third terminal electrodes 14 to 16 are electrodes for electrically and mechanically connecting the antenna element 10 to the printed circuit board 20. The first terminal electrode 14 is a ground electrode connected to a ground pattern 22 through a land 24 on the printed circuit board 20. The second terminal electrode 15 is a power feeding electrode connected to a power feeding line 28 through a land 25 on the printed circuit board 20. The third terminal electrode 16 is a ground electrode connected to the ground pattern 22 through a land 26 on the printed circuit board 20.

The first terminal electrode 14 is formed on one end side of the bottom surface 11b in the Y-direction and connected to a lower end of the side surface conductor pattern 13. The second and third terminal electrodes 15 and 16 are formed on the other end side of the bottom surface 11b in the Y-direction. The first terminal electrode 14 is formed on the entire width direction (X-direction) of the bottom surface 11b, and the terminal electrodes 15 and 16 are formed in the width direction of the bottom surface 11b with a predetermined interval interposed therebetween. That is, widths of the terminal electrodes 15 and 16 are each less than ½ of the width of the bottom surface 11b.

A gap between the upper surface conductor pattern 12 and second terminal electrode 15 forms a capacitance C1 and the upper surface conductor pattern 12 is connected to the power feeding line 28 through the capacitance C1. Further, a gap between the upper surface conductor pattern 12 and third terminal electrode 16 forms a capacitance C2 and the upper surface conductor pattern 12 is connected to the ground pattern 22 through the capacitance C2. In the present embodiment, the third terminal electrode 16 has an L-shape, wherein one end (open end) thereof close to the first terminal electrode 14 is bent at right angles to extend in a direction approaching the second terminal electrode 15. With this configuration, when the antenna element 10 is mounted on the printed circuit board 20, the open end of the third terminal electrode 16 faces an edge side of the printed circuit board 20, so that electromagnetic coupling to the ground pattern can be reduced to improve the radiation efficiency. Further, the area of the third terminal electrode 16 is larger than that of the second terminal electrode 15, so that the capacitance C2 can be made larger than the capacitance C1. Thus, an appropriate capacitance can be set according to requirements.

Figure 3:
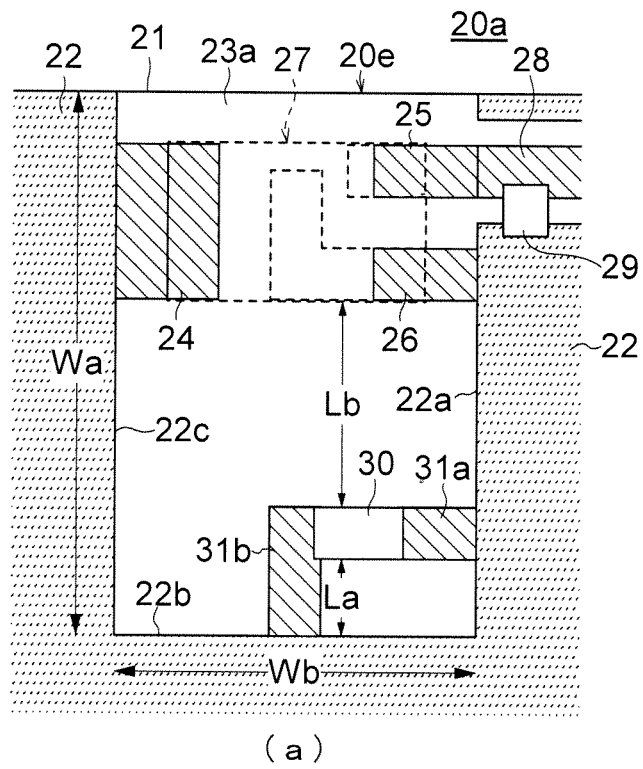
FIG. 3(a) is a schematic plan view illustrating a pattern layout of a front surface 20a of the printed circuit board 20 on which the antenna element 10 is mounted.
FIG. 3(b) is a schematic plan view illustrating a pattern layout of a rear surface 20b of the printed circuit board 20 on which the antenna element 10 is mounted.
Figure 3:
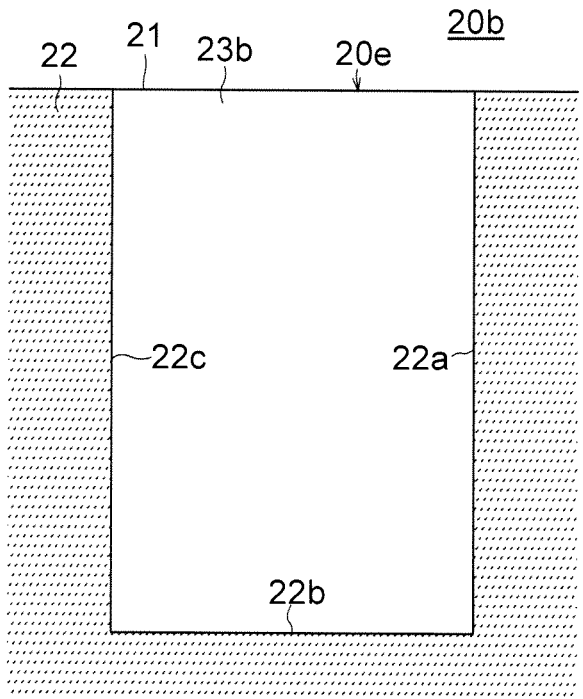

FIGS. 3(a) and 3(b) are each a schematic plan view illustrating a pattern layout on the printed circuit board 20 on which the antenna element 10 is mounted. FIG. 3(a) illustrates a layout of a front surface 20a of the printed circuit board 20 and FIG. 3(b) illustrates a layout of a rear surface 20b thereof. In particular, FIG. 3(b) is the layout of the rear surface 20b as viewed in a transparent manner from the front surface 20a side.

As illustrated in FIGS. 3(a) and 3(b), the printed circuit board 20 is a circuit board on which a communication circuit for constituting a wireless communication device is mounted and includes an insulating substrate 21 and a conductor pattern formed on front and rear surfaces of the insulating substrate 21. On the front surface 20a of the printed circuit board 20, a ground clearance region 23a is provided. The ground clearance region 23a has one side contacting an edge 20e of the printed circuit board 20 and other three sides defined by the ground pattern 22. The ground clearance region 23a is an insulating region in which mounting components and conductor patterns are excluded and surrounded by a first edge line 22a of the ground pattern 22, a second edge line 22b thereof, and a third edge line 22c thereof. Such an insulating region is provided also on the rear surface 20b side of the printed circuit board 20. That is, a ground clearance region 23b is provided in a region overlapping the ground clearance region 23a in a plan view. In a case of a multilayer substrate, such an insulating region is provided in all inner layers thereof.

The ground clearance region 23a is an elongated rectangular region having a short side coinciding with the edge 20e of the printed circuit board 20. Assuming that lengths of long and short sides of the ground clearance region 23a are Wa and Wb, respectively, it is preferable that Wa/Wb ≤1.5 is satisfied. Specifically, Wb and Wa should be set to 3 mm and 4.5 mm or more, respectively. Setting an aspect ratio of an antenna mounting region 27 to 1.5 or higher allows current flowing around a center side of the printed circuit board 20 to be increased, thereby enhancing the antenna radiation efficiency. In particular, it is possible to ensure radiation efficiency of 50% or more.

The antenna mounting region 27 on which the antenna element 10 is mounted is disposed within the ground clearance region 23a and adjacent to the edge 20e of the printed circuit board 20. When the antenna mounting region 27 is disposed adjacent to the edge 20e of the printed circuit board 20, about a half space as seen from the antenna element 10 is a free space in which there is no base material (conductor pattern), thereby enhancing the antenna radiation efficiency.

An area of the antenna mounting area 27 is substantially equal to that of the bottom surface 11b of the antenna element 10, and the three lands 24 to 26 are provided within the antenna mounting region 27. The lands 24 to 26 correspond respectively to the terminal electrodes 14 to 16 of the antenna element 10 and each have the same width as that of the corresponding terminal electrode. The land 25 is positioned closer to the edge 20e of the printed circuit board 20 than the land 26 and is connected to the power feeding line 28. The power feeding line 28 is disposed parallel to the edge 20e and is drawn in the ground clearance region 23a from the first edge line 22a side of the ground pattern 22. The land 26 is connected to the ground pattern edge line 22a adjacent thereto, and the land 24 is connected to the ground pattern edge line 22c adjacent thereto.

As illustrated in FIG. 1, in a state where the antenna element 10 is mounted on the printed circuit board 20, the terminal electrode 14 is connected to the ground pattern 22 through the land 24. The terminal electrode 15 is connected to the power feeding line (strip line) 28 through the land 25, and the terminal electrode 16 is connected to the ground pattern 22 through the land 26. As a result, the antenna element 10 is mounted across the ground clearance region 23a in the Y-direction so as to short-circuit the ground portions defining the two opposing sides 22a and 22c of the ground clearance region 23a.

An impedance adjusting element 29 is provided in the vicinity of a boundary (in the vicinity of a power feeding point) of the ground clearance region 23a at a portion between the power feeding line 28 and ground pattern 22. The impedance adjusting element 29 is, e.g., a chip capacitor and has one end connected to the power feeding line 28 and the other end connected to the ground pattern 22. Changing a value of the impedance adjusting element 29 allows fine adjustment of an input impedance of the antenna element 10.

The impedance adjusting element 29 may be provided in series to the power feeding line 28. For example, a chip inductor is used as the impedance adjusting element 29 and provided in a mounting gap on the power feeding line 28 with one end thereof connected to the second land 25 and the other end thereof connected to the power feeding line 28. Also in this case, changing an inductance value of the chip inductor allows fine adjustment of the input impedance.

The above impedance matching methods may selectively be applied, depending on a state of the input impedance, to the embodiments of the present invention.

A frequency adjusting element 30 is provided within the ground clearance region 23a. The frequency adjusting element 30 according to the present embodiment is, e.g., a chip capacitor and has one end connected to the edge line 22a of the ground pattern through a linear wiring pattern 31a and the other end connected to the edge line 22b of the ground pattern through a linear wiring pattern 31b.

In a case where the antenna mounting region 27 is close to the edge 20e of the printed circuit board, the ground clearance region 23a exists on the far side of the antenna mounting region 27 as viewed from the edge 20e, and the frequency adjusting element 30 is provided within this ground clearance region 23a. The frequency adjusting element 30 according to the present embodiment is spaced as far from the antenna mounting region 27 as possible within the ground clearance region 23a.

Assuming that a distance between the frequency adjusting element 30 and edge line 22b and a distance between the frequency adjusting element 30 and antenna mounting region 27 are La and Lb, respectively, it is preferable that La<Lb is satisfied. When the frequency adjusting element 30 is disposed near the antenna element 10, an antenna resonance frequency becomes very sensitive to a change in value of the frequency adjusting element 30, making it very difficult to achieve fine adjustment of the resonance frequency. On the other hand, when the frequency adjusting element 30 is spaced as far from the antenna mounting region as possible, the resonance frequency becomes less sensitive to the change in value of the frequency adjusting element 30, facilitating fine adjustment of the resonance frequency.

Current contributing to radiation of the antenna device is well distributed not only around the antenna element 10 but also around a boundary between the ground clearance region 23a and ground pattern 22 on the printed circuit board 20. Thus, a change rate of a resonance frequency fc may be reduced if a length of a current propagation path from a power feeding portion of the antenna element 10 to the frequency adjusting element 30 can be increased. A connection pattern of the frequency adjusting element 30a according to this embodiment has an L-shape, and the second end of the frequency adjusting element 30b is connected to the edge line 22b through the wiring pattern 30b. With this configuration, the length of the current propagation path can be increased to thereby reduce the change rate of the resonance frequency.

Figure 4:
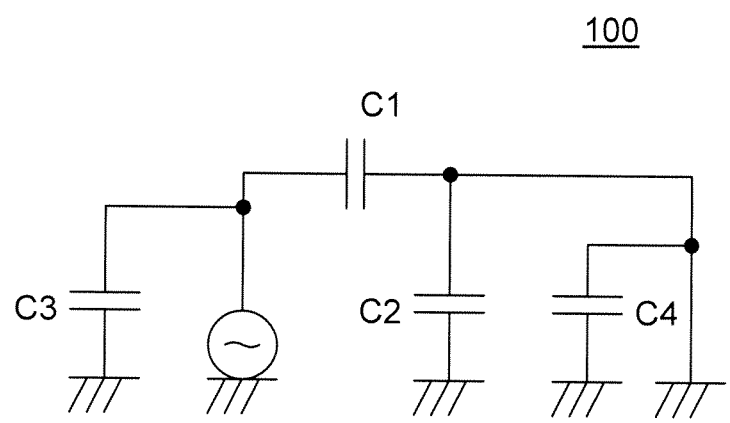
FIG. 4 is an equivalent circuit diagram of the antenna device 100.

FIG. 4 is an equivalent circuit diagram of the antenna device 100.

As illustrated in FIG. 4, the antenna device 100 includes capacitances C1 to C4. The capacitance C1 is formed by a gap between the upper surface conductor pattern 12 and second terminal electrode 15, and the capacitance C2 is formed by a gap between the upper surface conductor pattern 12 and third terminal electrode 16. The third capacitance C3 is the impedance adjusting element 29 and is provided in parallel to the power feeding point (power feeding line), and the capacitance C4 is the frequency adjusting element 30 and is provided in parallel to the capacitance C2.

The input impedance of the antenna device 100 can be adjusted by changing the value of the capacitance C3 serving as the impedance adjusting element 29. The value of the impedance adjusting element 29 can be changed by selecting a desired element value of a commercially available chip component. For some situations, a short pattern may be used as the impedance adjusting element, or the impedance adjusting element may be made into an open state so as not to be connected to the ground pattern.

The resonance frequency of the antenna device 100 can be adjusted by changing a value of the capacitance C4 serving as the frequency adjusting element 30. For example, when the value of the capacitance C4 is increased, the resonance frequency is decreased; on the other hand, when the value of the capacitance C4 is decreased, the resonance frequency is increased. In the present embodiment, the frequency adjusting element 30 is spaced as far from the antenna element 10 as possible, so that an electromagnetic coupling between the frequency adjusting element 30 and antenna element 10 can be reduced, thereby preventing the antenna resonance frequency from being sensitive to the change in the capacitance C4. Thus, even if a commercially available chip component is used as the frequency adjusting element 30, fine adjustment of the resonance frequency can be made.

As described above, the antenna device 100 according to the present embodiment has the frequency adjusting element within the ground clearance region 23a, thereby facilitating adjustment of the antenna resonance frequency. In particular, the frequency adjusting element is spaced far from the antenna element, reducing the electromagnetic coupling thereof to the antenna element, which also facilitates the fine adjustment of the resonance frequency. Further, according to the present embodiment, the connection pattern of the frequency adjusting element 30 has an L-shape, thereby further reducing a change rate of the resonance frequency.

With reference to FIGS. 5 to 16, a variation of the frequency adjusting element will be described. Hereinafter, the same reference numerals are given to substantially the same components as those of the antenna device 100 according to the first embodiment, and thus detailed descriptions thereof will be omitted.

Figure 5:
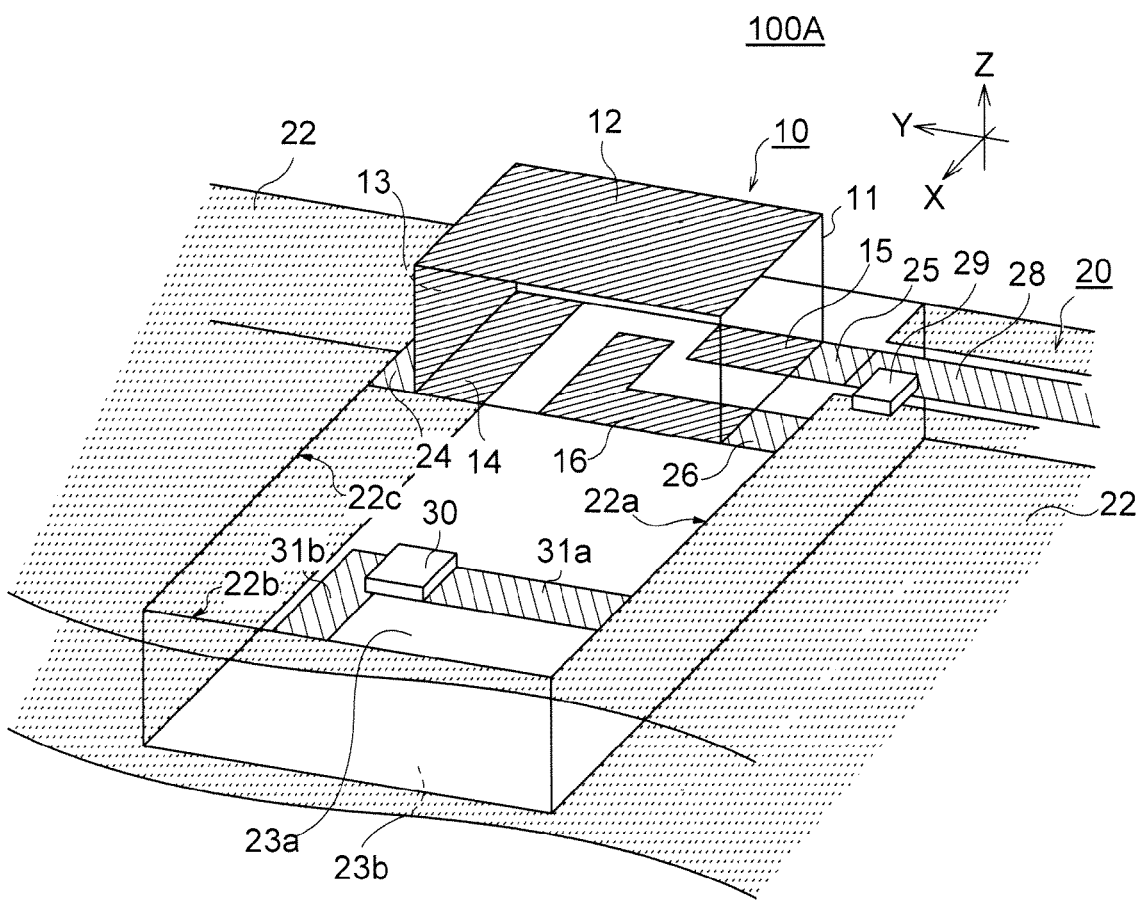
FIG. 5 is a schematic perspective view illustrating a configuration of an antenna device 100A according to a second embodiment of the present invention.

FIG. 5 is a schematic perspective view illustrating a configuration of an antenna device according to a second embodiment of the present invention.

As illustrated in FIG. 5, an antenna device 100A according to the second embodiment is featured in that the frequency adjusting element 30 is positioned at a center of the ground clearance region 23a in a width direction (Y-direction) and that a length of the wiring pattern 31a is increased. A position of the frequency adjusting element 30 in the X-direction is not changed and only a position thereof is shifted in the Y-direction. In this configuration, the sensitivity to the resonance frequency becomes slightly higher than in the antenna device 100. However, the fine adjustment of the resonance frequency can be made even if a commercially available chip capacitor is used.

Figure 6:
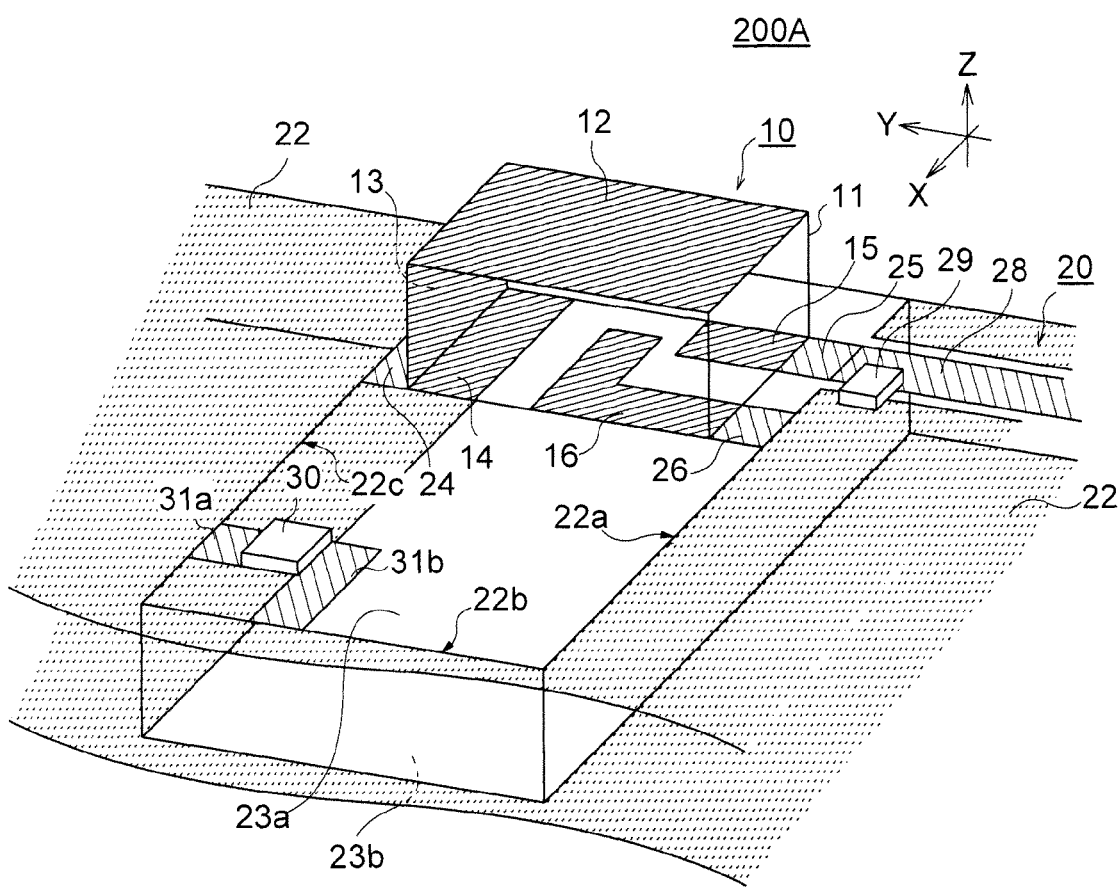
FIG. 6 is a schematic perspective view illustrating a configuration of an antenna device 200A according to a third embodiment of the present invention.

FIG. 6 is a schematic perspective view illustrating a configuration of an antenna device according to a third embodiment of the present invention.

As illustrated in FIG. 6, an antenna device 200A according to a third embodiment is featured in that the frequency adjusting element 30 is disposed at a position symmetrical to the position thereof in the antenna device 100 of the first embodiment and that one end of the frequency adjusting element 30 is connected to the edge line 22c of the ground pattern. In other words, the frequency adjusting element 30 of the first embodiment is disposed near the edge line 22a side, whereas the frequency adjusting element 30 of the third embodiment is disposed near the edge line 22c side. Also in this configuration, the same characteristics as in the antenna device 100 can be obtained, and thus the fine adjustment of the resonance frequency can be made using a commercially available chip capacitor.

Figure 7:
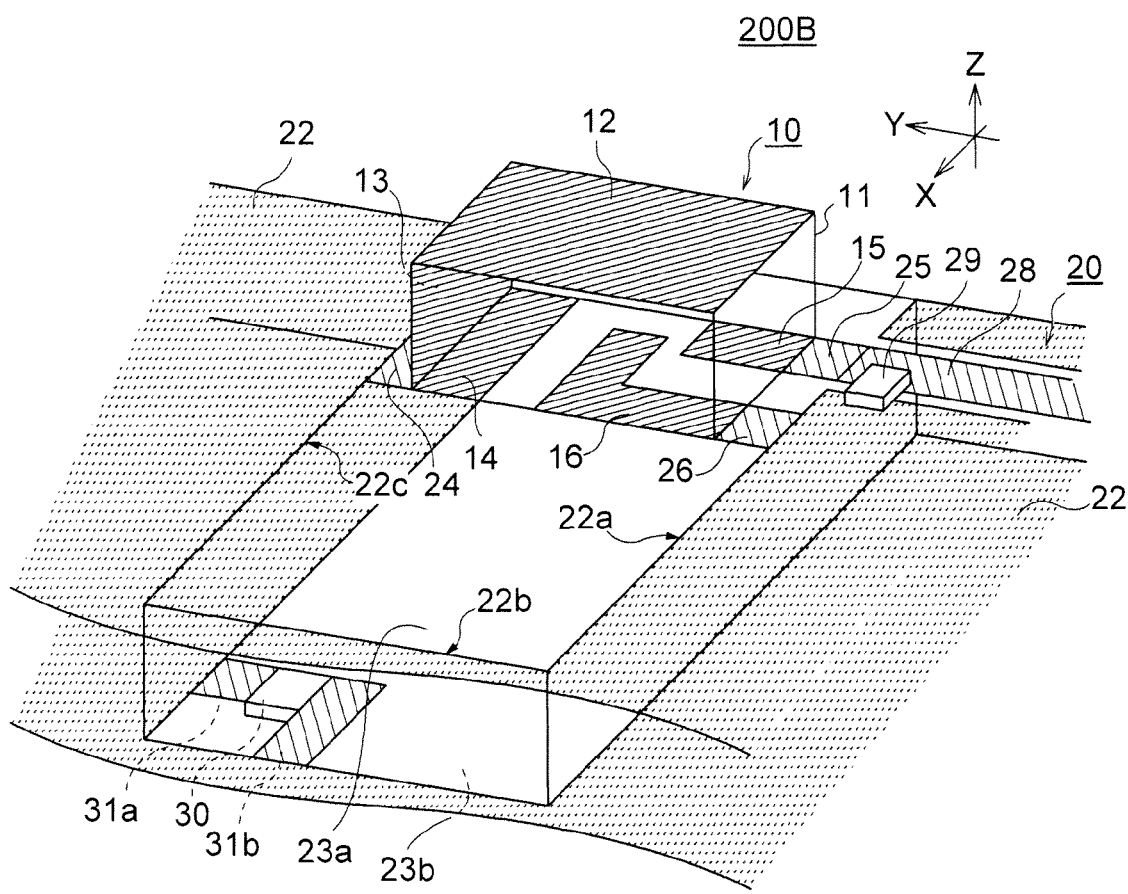
FIG. 7 is a schematic perspective view illustrating a configuration of an antenna device 200B according to a fourth embodiment of the present invention.

FIG. 7 is a schematic perspective view illustrating a configuration of an antenna device according to a fourth embodiment of the present invention.

As illustrated in FIG. 7, an antenna device 200B according to the fourth embodiment differs from the antenna device 200A of the third embodiment in that the frequency adjusting element 30 is provided within the ground clearance region 23b on the rear side of the printed circuit board 20. The one end of the frequency adjusting element 30 is connected to the edge line 22c of the ground pattern, and the other end thereof is connected to the edge line 22b. That is, the frequency adjusting element 30 in the antenna device 200B and that in the antenna device 200A of the third embodiment are disposed at position overlapping each other in a plan view. Also in this configuration, the same characteristics as in the antenna devices 100A and 200A can be obtained, and thus the fine adjustment of the resonance frequency can be made using a commercially available chip capacitor.

Figure 8:
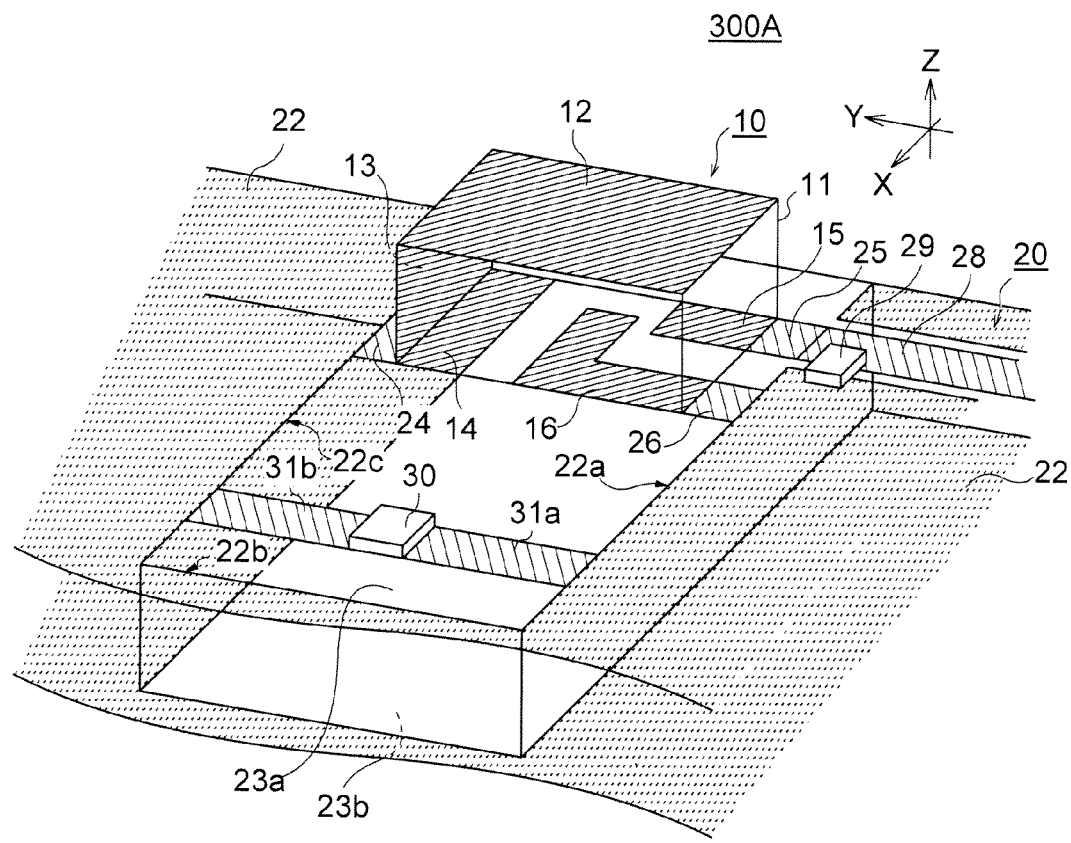
FIG. 8 is a schematic perspective view illustrating a configuration of an antenna device 300A according to a fifth embodiment of the present invention.

FIG. 8 is a schematic perspective view illustrating a configuration of an antenna device according to a fifth embodiment of the present invention.

As illustrated in FIG. 8, an antenna device 300A according to the fifth embodiment differs from the antenna device 100A of the second embodiment in that one end of the wiring pattern 31b is connected not to the edge line 22b of the ground pattern but to the edge line 22c thereof to obtain a linear wiring pattern as a whole. Even in such a configuration, the same characteristics as in the antenna device 100A can be obtained, and thus the fine adjustment of the resonance frequency can be made using a commercially available chip capacitor. However, as compared to the antenna device 100A, the change rate of the resonance frequency fc is slightly increased because the length of the current propagation path from the power feeding portion of the antenna element 10 to the frequency adjusting element 30 is slightly short.

Current contributing to radiation of the antenna device is well distributed not only around the antenna element 10 but also around the boundary between the ground clearance region 23a and ground pattern 22 on the printed circuit board 20. Thus, the change rate of the resonance frequency fc may be reduced if the length of the current propagation path from the power feeding portion of the antenna element 10 to the frequency adjusting element 30 can be increased.

Figure 9:
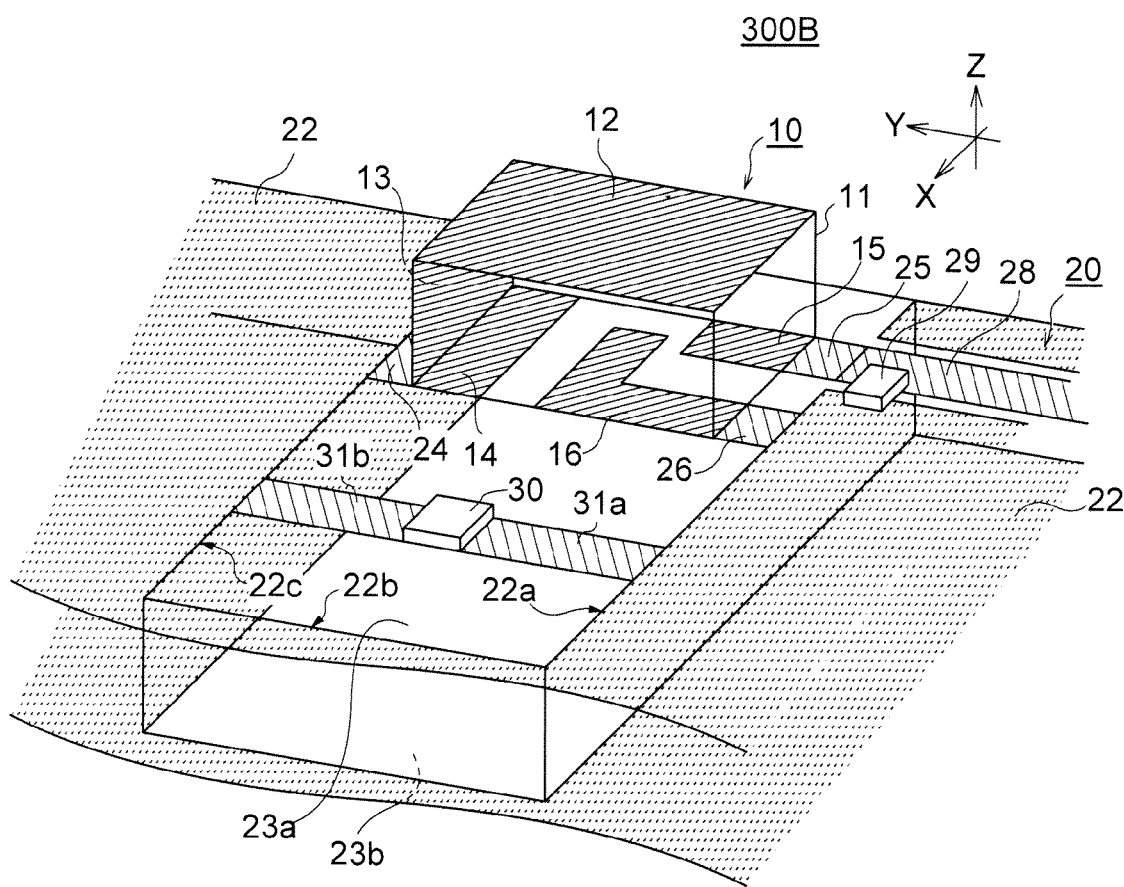
FIG. 9 is a schematic perspective view illustrating a configuration of an antenna device 300B according to a sixth embodiment of the present invention.

FIG. 9 is a schematic perspective view illustrating a configuration of an antenna device according to a sixth embodiment of the present invention.

As illustrated in FIG. 9, an antenna device 300B according to the sixth embodiment is featured in that the X-direction position of the frequency adjusting element 30 is closer to the antenna element 10 side than in the antenna device 300A of the fifth embodiment. Thus, the sensitivity to the resonance frequency becomes slightly higher than in the antenna device 300A. However, the fine adjustment of the resonance frequency can be made using a commercially available chip capacitor.

Figure 10:
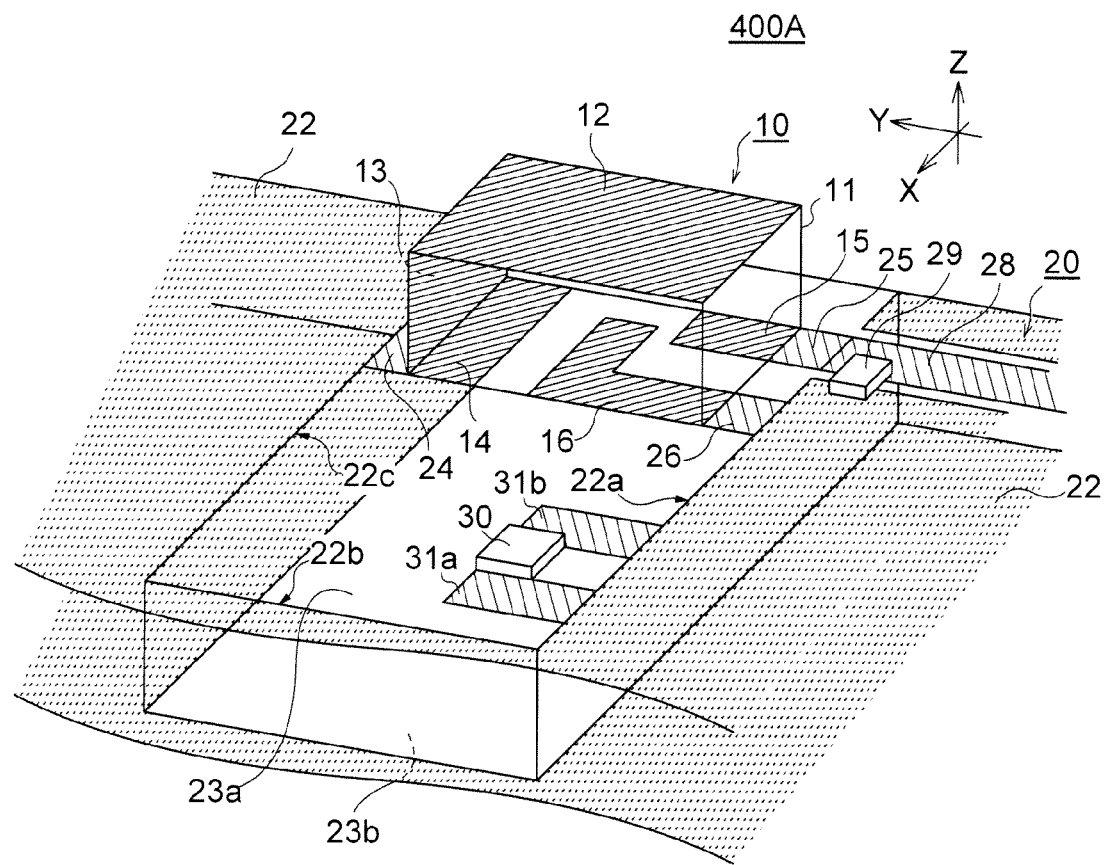
FIG. 10 is a schematic perspective view illustrating a configuration of an antenna device 400A according to a seventh embodiment of the present invention.

FIG. 10 is a schematic perspective view illustrating a configuration of an antenna device according to a seventh embodiment of the present invention.

As illustrated in FIG. 10, an antenna device 400A according to the sixth embodiment is featured in that the frequency adjusting element 30 is disposed near the edge line 22a of the ground pattern and that both ends of the frequency adjusting element 30 are connected to the edge line 22a through the wiring patterns 31a and 31b, respectively. Even in such a configuration, the fine adjustment of the resonance frequency can be made using a commercially available chip capacitor.

Figure 11:
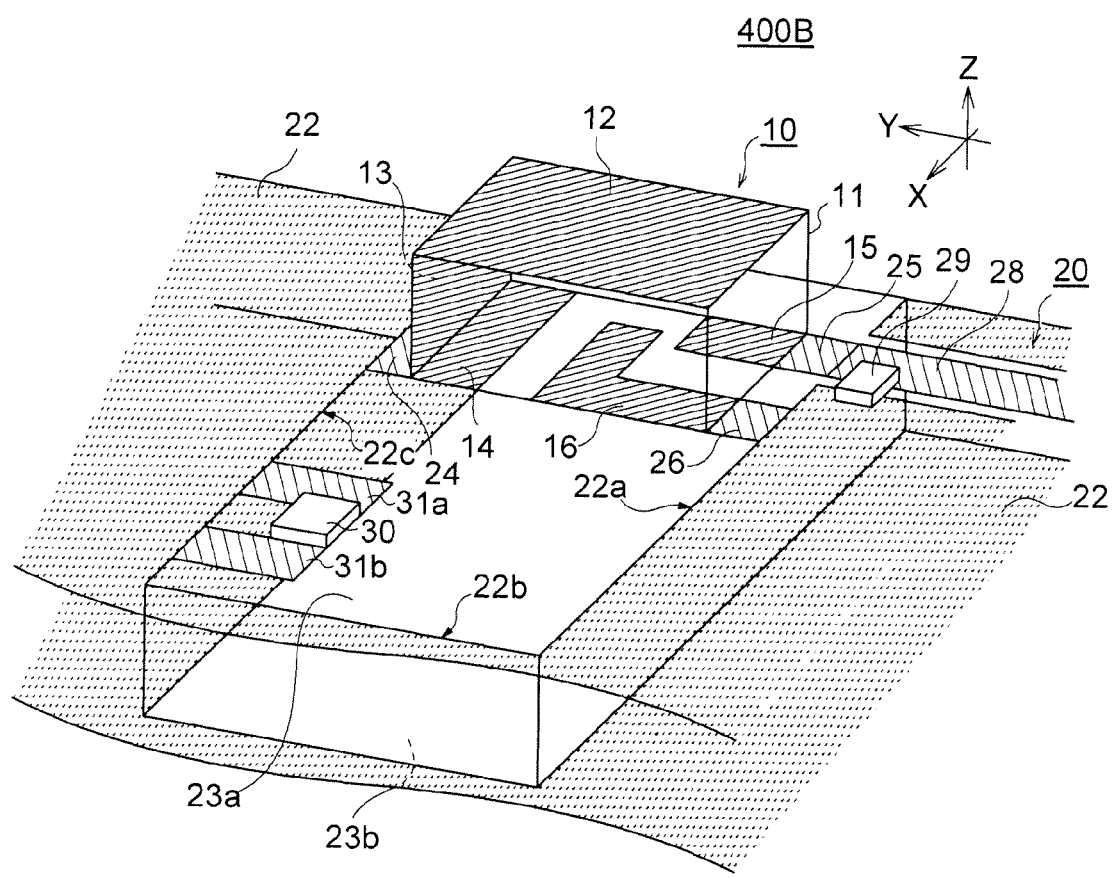
FIG. 11 is a schematic perspective view illustrating a configuration of an antenna device 400B according to a seventh embodiment of the present invention.

FIG. 11 is a schematic perspective view illustrating a configuration of an antenna device according to a seventh embodiment of the present invention.

As illustrated in FIG. 11, an antenna device 400B according to the seventh embodiment is featured in that the frequency adjusting element 30 is disposed at a position symmetrical to the position thereof in the antenna device 400A so as to be located near the edge line 22c of the ground pattern and that the both ends of the frequency adjusting element 30 are connected to the edge line 22c through the wiring patterns 31a and 31b, respectively. Even in such a configuration, the fine adjustment of the resonance frequency can be made using a commercially available chip capacitor.

Figure 12:
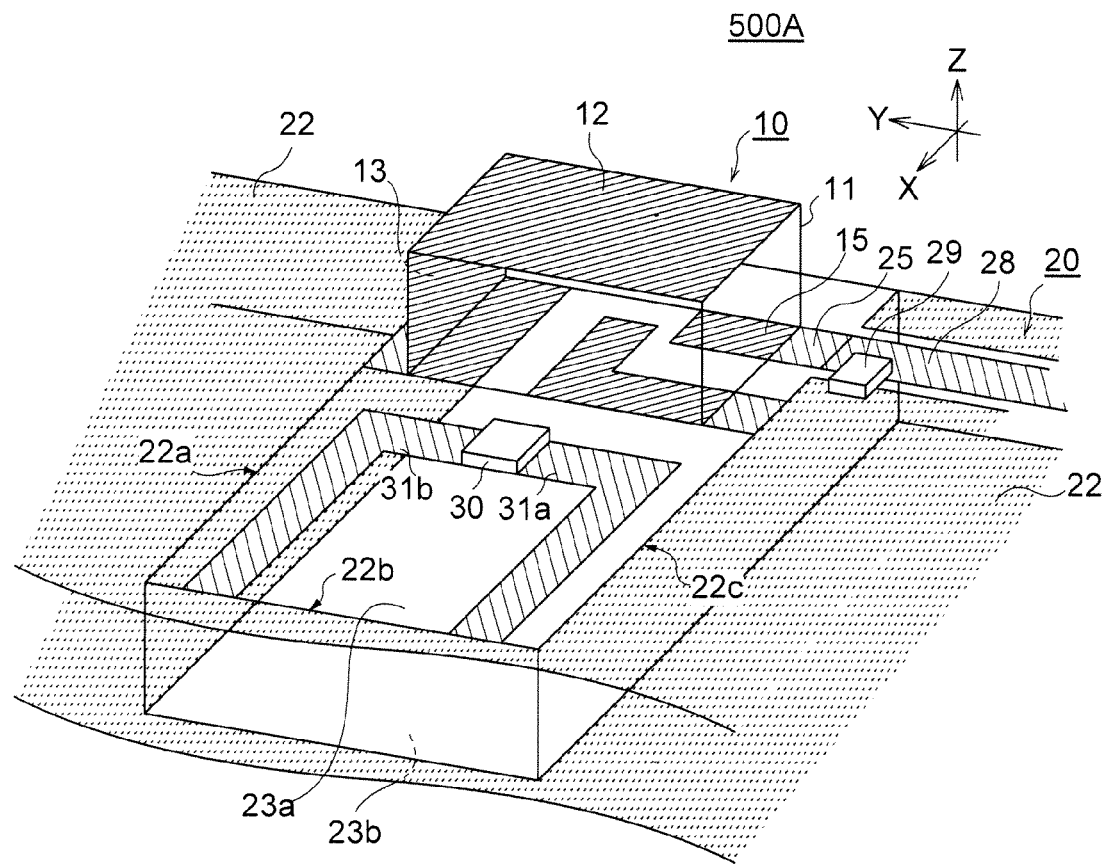
FIG. 12 is a schematic perspective view illustrating a configuration of an antenna device 500A according to an eighth embodiment of the present invention.

FIG. 12 is a schematic perspective view illustrating a configuration of an antenna device according to an eighth embodiment of the present invention.

As illustrated in FIG. 12, an antenna device 500A according to the eighth embodiment is featured in that the position of the frequency adjusting element 30 is closer to the antenna element 10 side than in the antenna device 300A of the fifth embodiment. The both ends of the frequency adjusting element 30 are connected to the edge line 22b of the ground pattern through the wiring patterns 31a and 31b, respectively. Assuming that a distance between the frequency adjusting element 30 and edge line 22b and a distance between the frequency adjusting element 30 and antenna mounting region 27 are La and Lb, respectively, La<Lb is not satisfied in the present embodiment, so that the sensitivity to the resonance frequency is comparatively high. However, even in such a configuration, the fine adjustment of the resonance frequency can be made using a commercially available chip capacitor.

Figure 13:
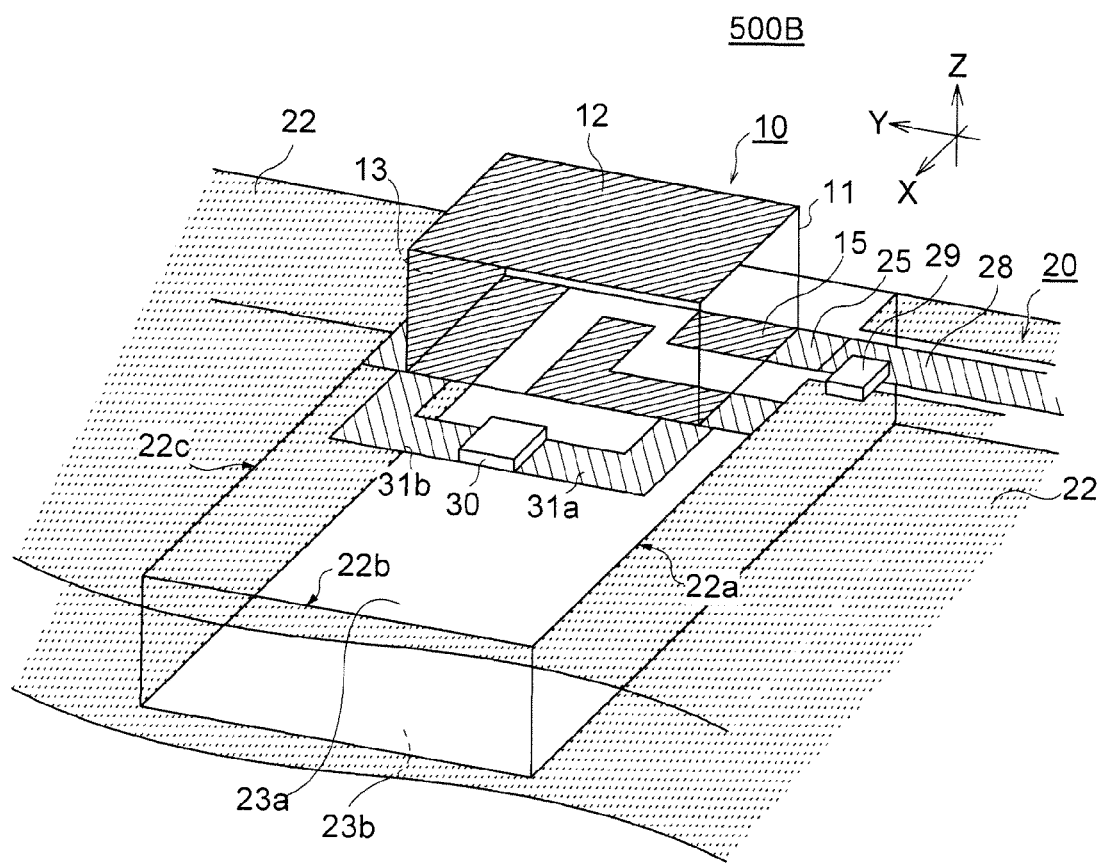
FIG. 13 is a schematic perspective view illustrating a configuration of an antenna device 500B according to a ninth embodiment of the present invention.

FIG. 13 is a schematic perspective view illustrating a configuration of an antenna device according to a ninth embodiment of the present invention.

As illustrated in FIG. 13, an antenna device 500B according to the ninth embodiment differs from the antenna device 500A of the eighth embodiment in that the both ends of the frequency adjusting element 30 are connected to the lands in the antenna mounting region 23a. More specifically, one end of the frequency adjusting element 30 is connected to the ground pattern 22 through the wiring pattern 31a and third land 26, and the other end thereof is connected to the ground pattern 22 through the wiring pattern 31b and first land 24. As described above, in the antenna device 500B of the present embodiment, the individual terminals of the frequency adjusting element 30 are not directly connected to the ground pattern. However, even in such a configuration, the fine adjustment of the resonance frequency can be made using a commercially available chip capacitor as in the above antenna device 500A.

Figure 14:
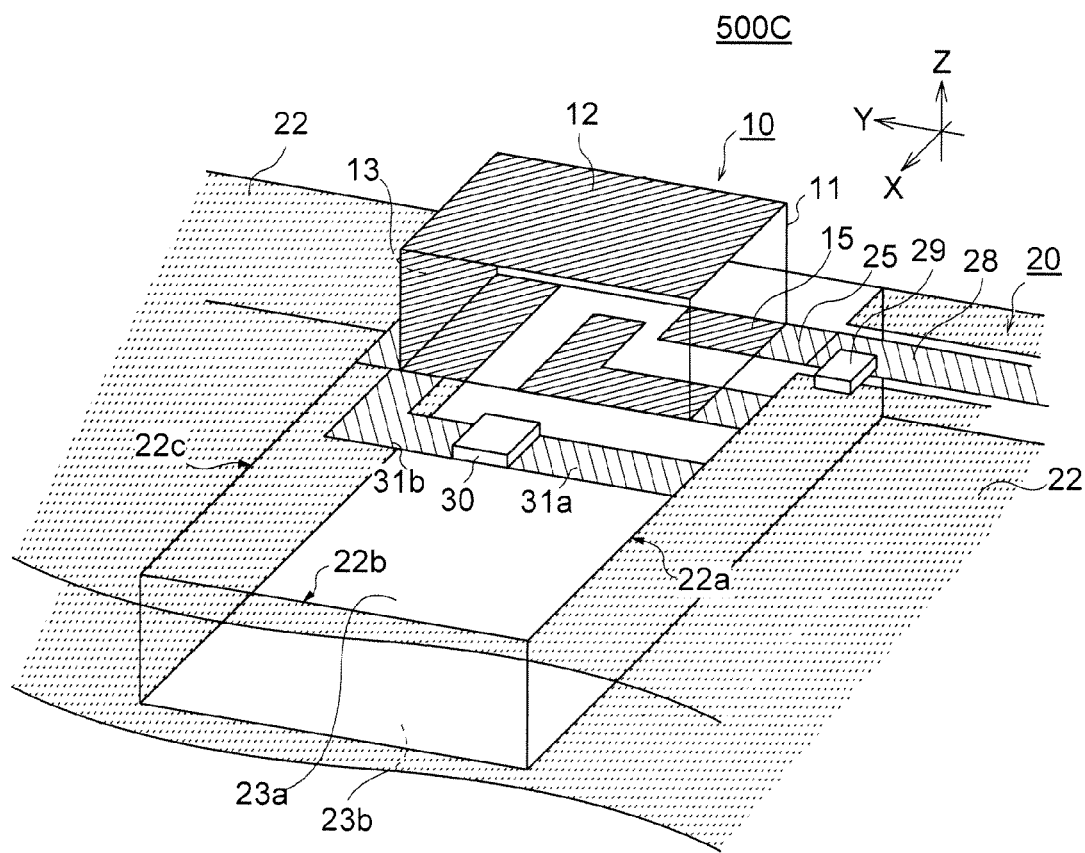
FIG. 14 is a schematic perspective view illustrating a configuration of an antenna device 500C according to a tenth embodiment of the present invention.

FIG. 14 is a schematic perspective view illustrating a configuration of an antenna device according to a tenth embodiment of the present invention.

As illustrated in FIG. 14, an antenna device 500C according to the tenth embodiment differs from the antenna device 500B of the ninth embodiment in that only one end of the frequency adjusting element 30 is connected to the land in the antenna mounting region 23a. More specifically, one end of the frequency adjusting element 30 is connected to the edge line 22a of the ground pattern 22 through the wiring pattern 31a, and the other end thereof is connected to the ground pattern 22 through the wiring pattern 31b and first land 24. Even in such a configuration, the fine adjustment of the resonance frequency can be made using a commercially available chip capacitor as in the above antenna devices 500A and 500B.

Figure 15:
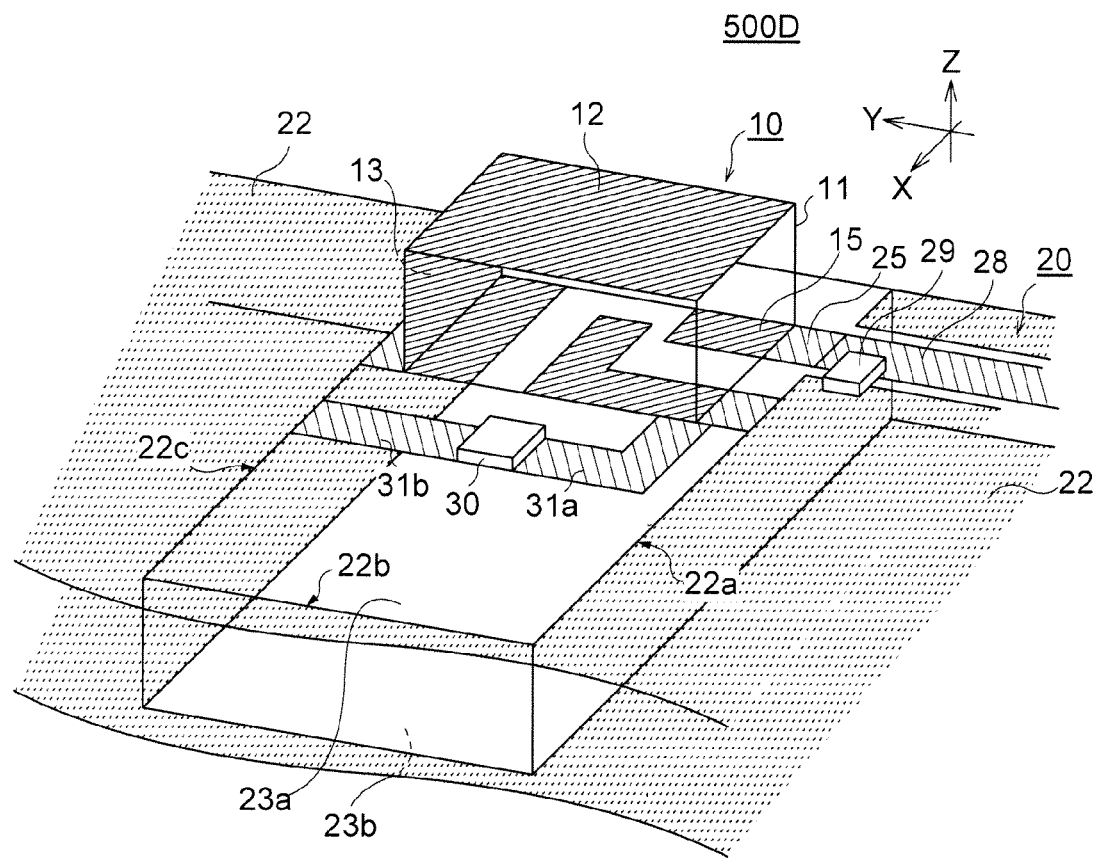
FIG. 15 is a schematic perspective view illustrating a configuration of an antenna device 500D according to an eleventh embodiment of the present invention.

FIG. 15 is a schematic perspective view illustrating a configuration of an antenna device according to an eleventh embodiment of the present invention.

As illustrated in FIG. 15, an antenna device 500D according to the eleventh embodiment is featured in that the frequency adjusting element 30 is disposed at a position symmetrical to the position thereof in the antenna device 500C and differs from the antenna device 500B of the ninth embodiment in that only one end of the frequency adjusting element 30 is connected to the land in the antenna mounting region 23a. More specifically, one end of the frequency adjusting element 30 is connected to the edge line 22c of the ground pattern 22 through the wiring pattern 31b, and the other end thereof is connected to the ground pattern 22 through the wiring pattern 31a and third land 26. Even in such a configuration, the fine adjustment of the resonance frequency can be made using a commercially available chip capacitor as in the above antenna devices 500A to 500C. The antenna device 500A has the longest current propagation path among the antenna devices 500A to 500D, so that the antenna device 500A has the lowest (poorest) change rate of the resonance frequency fc.

Figure 16:
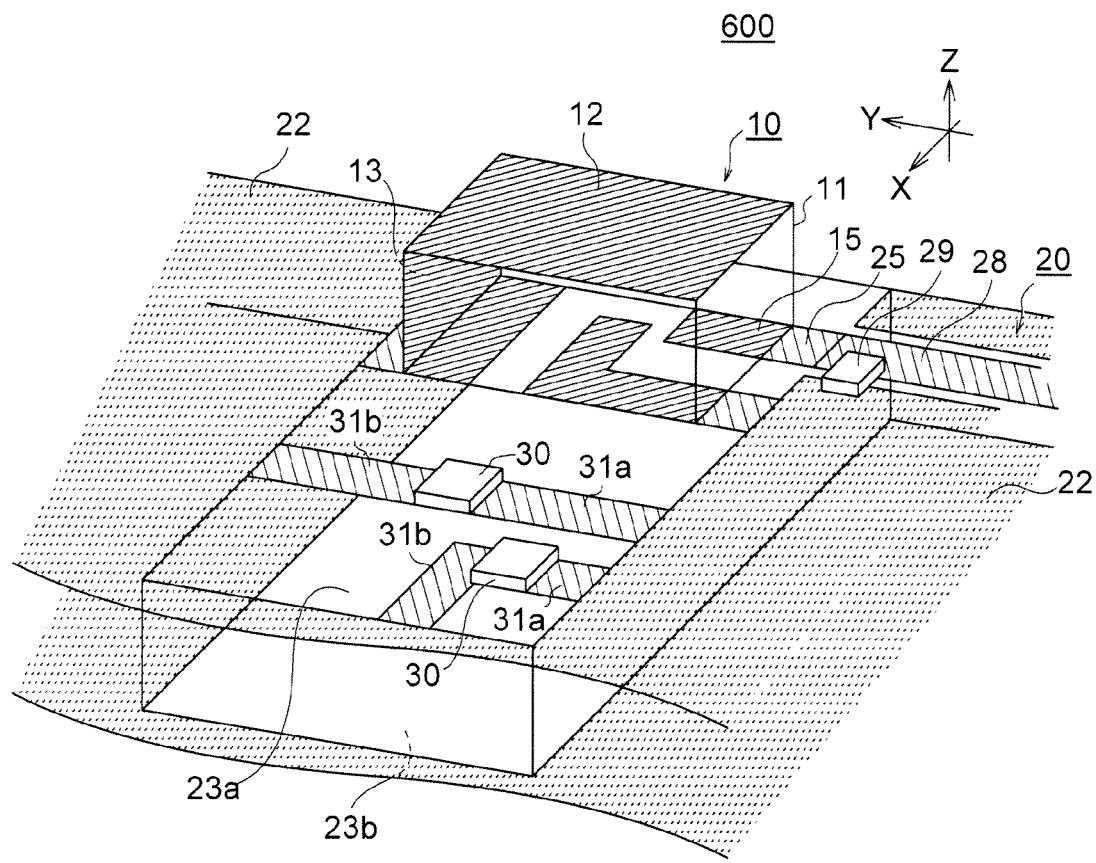
FIG. 16 is a schematic perspective view illustrating a configuration of an antenna device 600 according to a twelfth embodiment of the present invention.

FIG. 16 is a schematic perspective view illustrating a configuration of an antenna device according to a twelfth embodiment of the present invention.

As illustrated in FIG. 16, an antenna device 600 according to the thirteenth embodiment has a plurality of frequency adjusting elements and is obtained by combining the frequency adjusting element 30 of the antenna device 100 of the first embodiment and frequency adjusting element 30 of the antenna device 300B of the fourth embodiment. This configuration allows arbitrary selection of the change rate of the resonance frequency. The two or more frequency adjusting elements can be variously combined.

As described above, the antenna devices according to the first to twelfth embodiments can change the resonance frequency fc by changing the element value of the frequency adjusting element, although the sensitivity to the resonance frequency fc slightly differs depending on the layout of the frequency adjusting element 30, and the fine adjustment of the resonance frequency can be made with ease using a commercially available chip capacitor.

Figure 17:
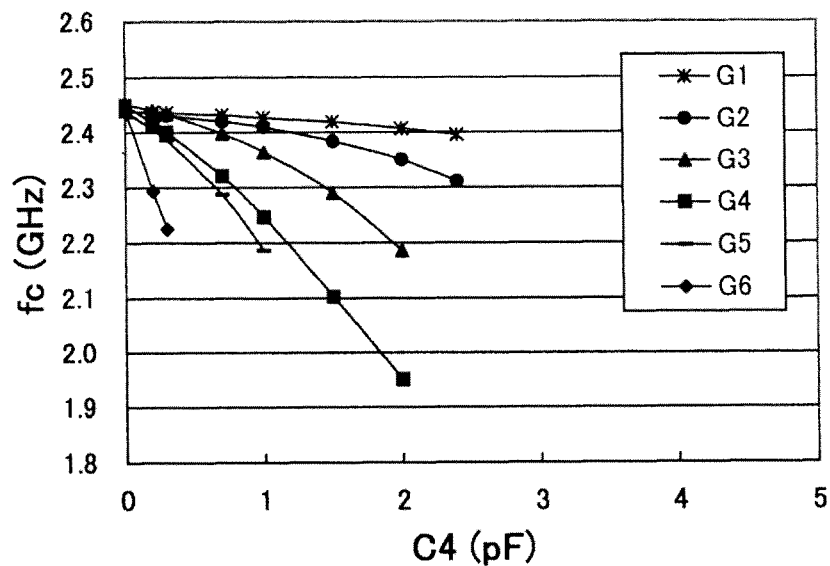
FIG. 17 is a graph representing a simulation result of frequency characteristics of the antenna devices according to the present invention.

FIG. 17 is a graph representing a simulation result of frequency characteristics of the antenna devices according to the present invention, in which a horizontal axis represents a value of the capacitance C4 formed by the frequency adjusting element and a vertical axis represents the resonance frequency fc. Curved lines G1 to G6 of FIG. 17 represent characteristics of the antenna devices 100, 100A, 300A, 300B, 500A, and 500B, respectively.

As represented in FIG. 17, the resonance frequency fc of each antenna device is decreased as the capacitance C4 formed by the frequency adjusting element 30 is increased. The closer the frequency adjusting element 30 is to the antenna element 10, the higher the change rate of the resonance frequency fc becomes. For example, in the antenna device 100 (curved line G1), the resonance frequency fc does not change so much even if the capacitance C4 is changed, whereas in the antenna device 500B (curved line G6), the resonance frequency significantly changes with a slight change in the capacitance C4. As described above, it can be understood that the change rate of the resonance frequency fc with respect to the frequency adjusting element 30 differs depending on the position of the frequency adjusting element 30 and a pattern shape thereof, and that the sensitivity to the resonance frequency fc becomes poorer as the frequency adjusting element 30 is spaced far from the antenna element 10.

A current contributing to radiation of the antenna device is well distributed not only around the antenna element 10 but also around the boundary between the ground clearance region 23a and ground pattern 22 on the printed circuit board 20. Thus, the change rate of the resonance frequency fc may be reduced if a length of the current propagation path from the power feeding portion of the antenna element 10 to the frequency adjusting element 30 can be increased.

Figure 18:
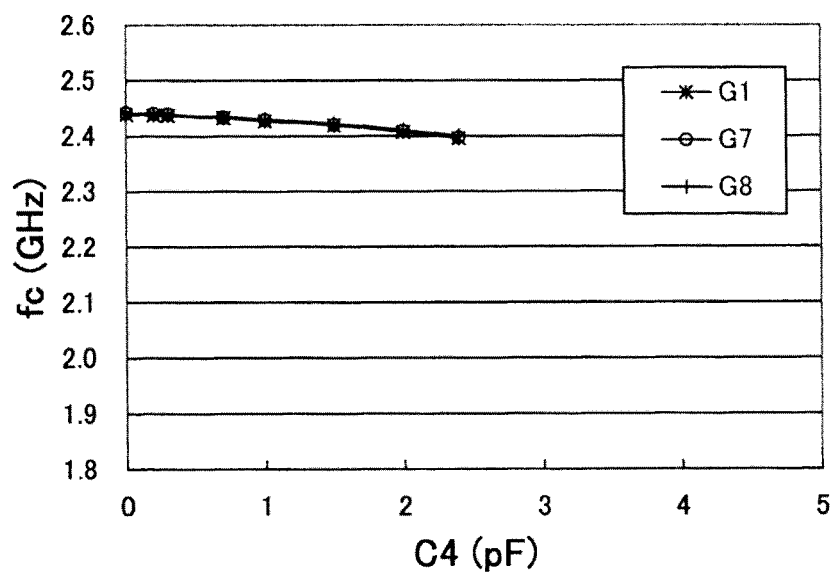
FIG. 18 is a graph representing a simulation result of frequency characteristics of the antenna devices according to the present invention.

FIG. 18 is a graph representing a simulation result of frequency characteristics of the antenna devices according to the present invention, in which curved lines G1, G7, and G8 represent characteristics of the antenna devices 100, 200A, and 200B, respectively.

As illustrated in FIG. 18, the change rate of the resonance frequency fc with respect to the capacitance C4 is substantially the same among the antenna devices 100, 200A, and 200B. Thus, even if the position of the frequency adjusting element 30 is reversed in terms of the Y-direction or in terms of front and rear surfaces, the resonance frequency characteristics hardly change as long as the distance from the antenna element 10 does not change.

Other configurations of the antenna element 10 will be described in detail.

Figure 19:
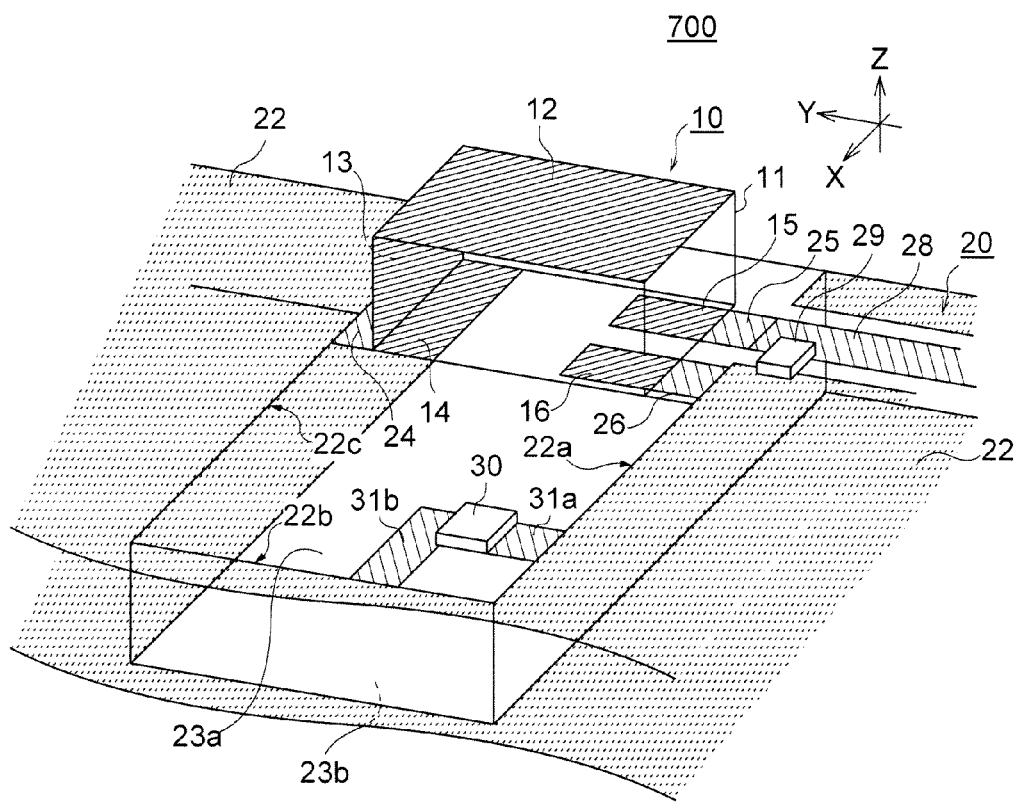
FIG. 19 is a schematic perspective view illustrating a configuration of an antenna device 700 according to a thirteenth embodiment of the present invention.
Figure 20:
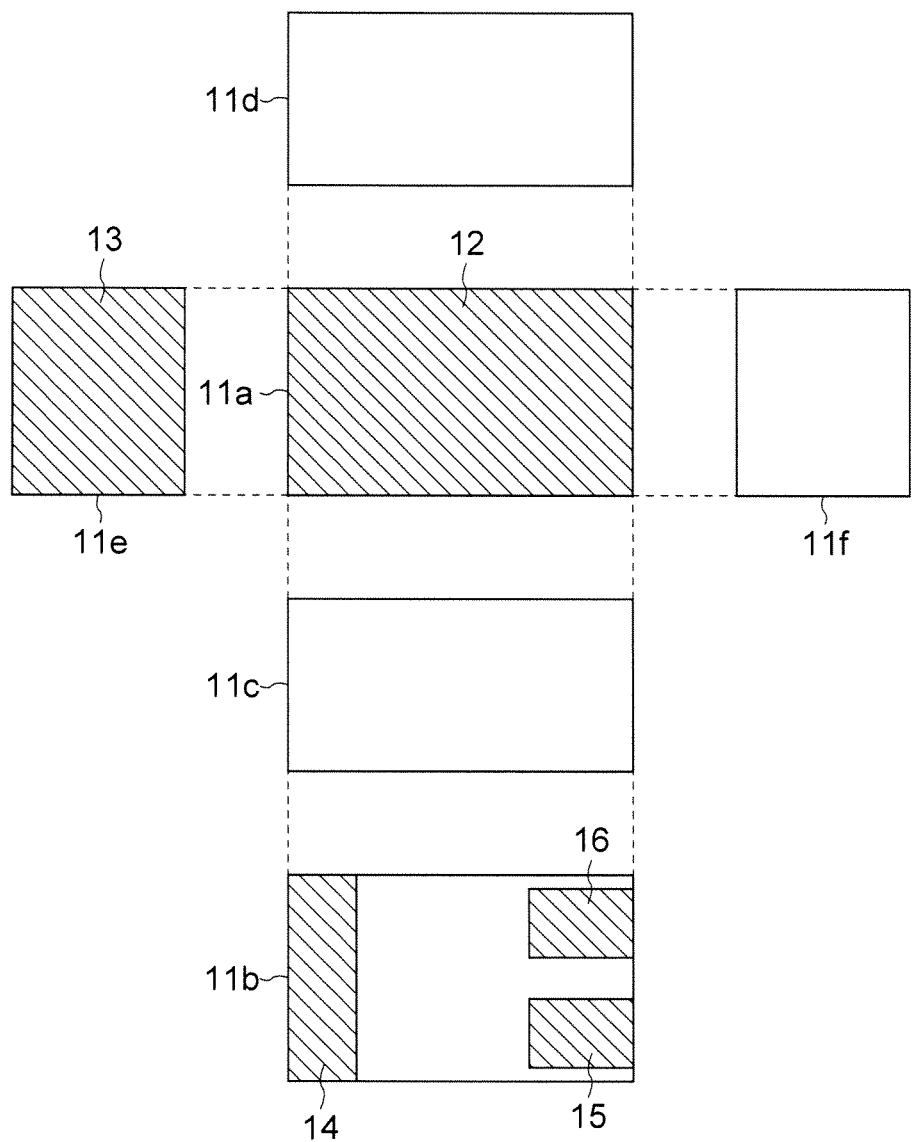
FIG. 20 is a developed view of an antenna element 10.

FIG. 19 is a schematic perspective view illustrating a configuration of an antenna device according to a thirteenth embodiment of the present invention. FIG. 20 is a developed view of an antenna element.

As illustrated in FIGS. 19 and 20, an antenna device 700 is featured in that the terminal electrode 16 of the antenna element 10 has not an L-shape, but a rectangular shape, and the shape of the terminal electrode 16 is the same as that of the terminal electrode 15. Thus, the conductor patterns formed on the surfaces of the base 11 of the antenna element 10 assume a symmetrical configuration with respect to a center line of the base 11 extending in a longitudinal direction thereof. Further, although not especially limited, the terminal electrodes 15 and 16 are brought close to the center line and do not contact long sides of the bottom surface 11b. Other configurations are the same as those of the antenna device 100 according to the first embodiment, and detailed description will be omitted with the same reference numbers given to the same portions.

As described above, in the antenna device 700 according to the present embodiment, the conductor patterns formed on the surfaces of the base 11 assume a symmetrical configuration, so that even when a direction of the antenna element 10 is rotated by 180° about an axis (Z-axis) orthogonal to upper and lower surfaces of the base 11, the conductor pattern shape of the antenna element 10 as viewed from the edge side of the printed circuit board 20 does not change substantially. Therefore, the antenna characteristics do not significantly change due to the direction of the antenna element 10, facilitating antenna design.

Figure 21:
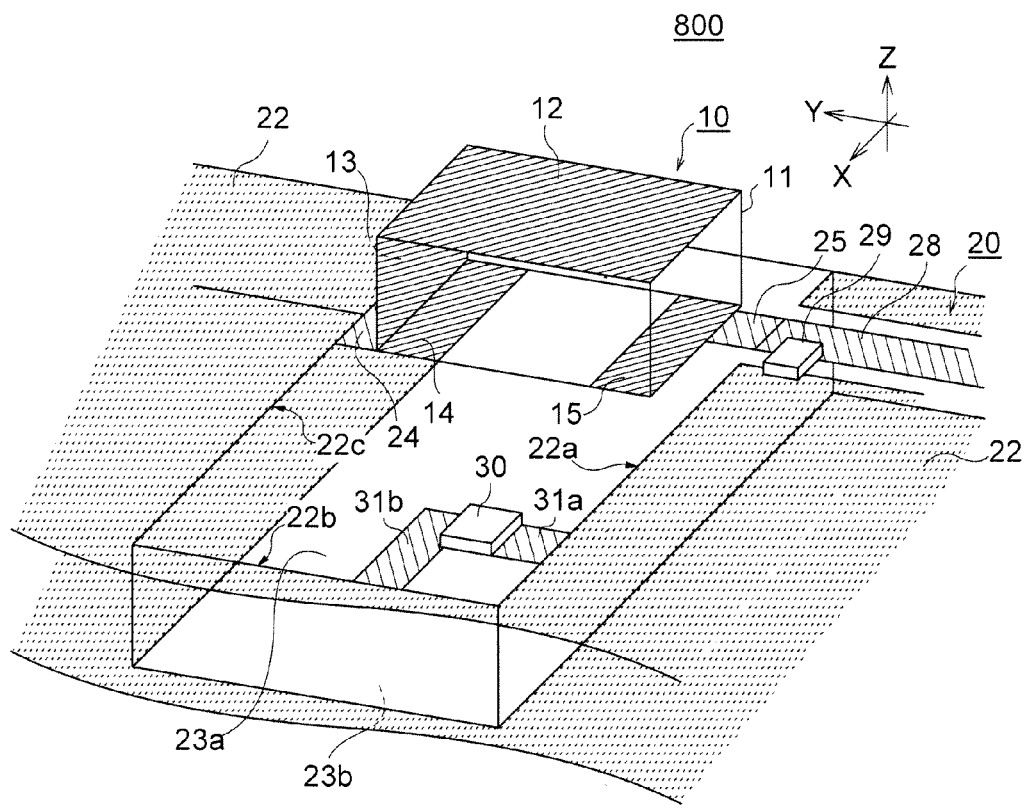
FIG. 21 is a schematic perspective view illustrating a configuration of an antenna device 800 according to a fourteenth embodiment of the present invention.
Figure 22:
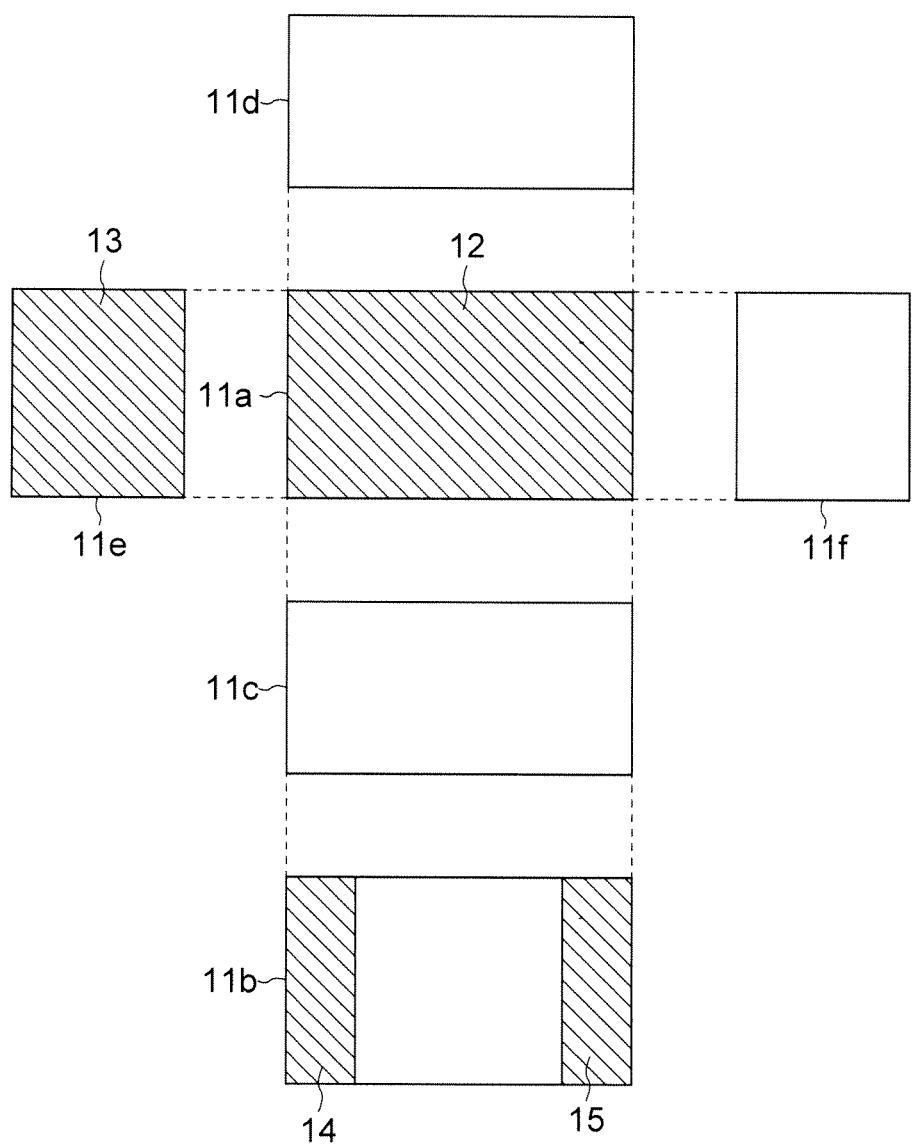
FIG. 22 is a developed view of the antenna element 10.

FIG. 21 is a schematic perspective view illustrating a configuration of an antenna device according to a fourteenth embodiment of the present invention. FIG. 22 is a developed view of the antenna element.

As illustrated in FIGS. 21 and 22, an antenna device 800 is featured in that the terminal electrode 16 of the antenna element 10 is omitted and that the terminal electrode 15 has the same shape as that of the terminal electrode 14. That is, like the first terminal electrode 14, the second terminal electrode 15 is formed on the entire width direction of the bottom surface 11b. Also in this case, the conductor patterns of the antenna element 10 assume a symmetrical configuration. Since the terminal electrode 15 is omitted, the capacitance C2 formed by a gap between the upper surface conductor pattern 12 and terminal electrode 16 does not exist. Other configurations are the same as those of the antenna device 100 according to the first embodiment, and detailed description will be omitted with the same reference numbers given to the same portions.

As described above, the conductor patterns formed on the surfaces of the base 11 of the antenna device 800 according to the present embodiment assume a symmetrical configuration with respect to the center line of the base 11 extending in the longitudinal direction thereof, so that even when a direction of the antenna element 10 is rotated by 180° about an axis (Z-axis) orthogonal to upper and lower surfaces of the base 11, the conductor pattern shape of the antenna element 10 as viewed from the edge side of the printed circuit board 20 does not change substantially. Therefore, the antenna characteristics do not significantly change due to the direction of the antenna element 10, facilitating antenna design.

Figure 23:
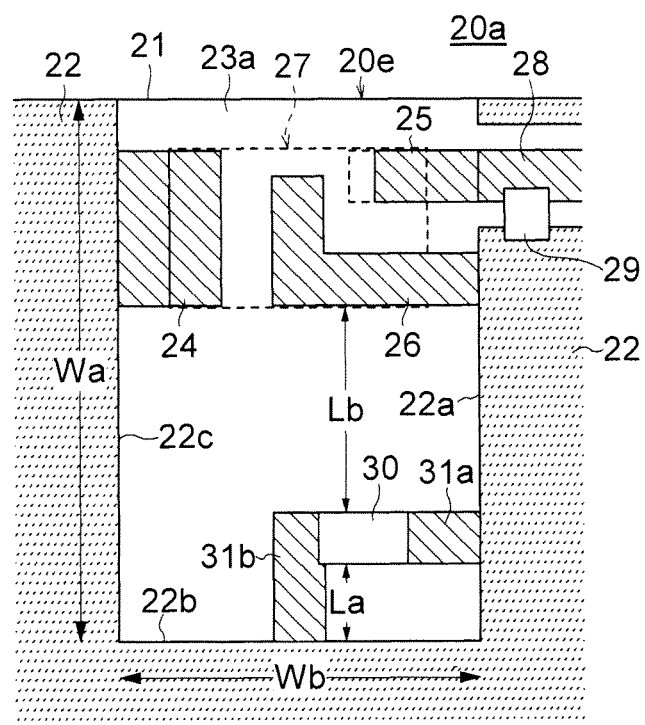
FIG. 23 is schematic plan view illustrating an antenna device according to a fifteenth embodiment of the present invention.

FIG. 23 is schematic plan view illustrating an antenna device according to a fifteenth embodiment of the present invention, which is a modification of the land pattern.

An antenna device according to the present embodiment is featured in that the land 26 in the antenna mounting region 27 has not a rectangular shape, but an L-shape. In this case, the terminal electrode 16 on the antenna element 10 side may be formed into an L-shape as illustrated in FIG. 2 or a rectangular shape as illustrated in FIG. 20. In any case, in a state where the antenna element 10 is mounted, a pattern formed between the antenna element 10 and printed circuit board 20 assumes an L-shape, thereby reducing electromagnetic coupling to the ground pattern to improve the radiation efficiency.

When the electrode patterns are formed between the base 11 and printed circuit board 20 using the terminal electrode or land as described above, the same effect can be obtained. Note that formation of the terminal electrode on the bottom surface of the base 11 is more preferable since a variation in characteristics due to displacement of the position of base 11 with respect to the printed circuit board 20 can be reduced.

Although the chip capacitor is used as the frequency adjusting element in the above-described embodiments, a chip inductor may be used in place of the chip capacitor. The use of the inductance allows the resonance frequency fc to be adjusted to the high-band side. Further, the smaller the inductance value, the higher the resonance frequency fc becomes. It is possible to adjust the resonance frequency fc to the high-band side also by making the capacitance to resonate in a higher mode (at higher harmonics). The use of the above two methods allows continuous adjustment of the resonance frequency fc over a wide band.

Figure 24:
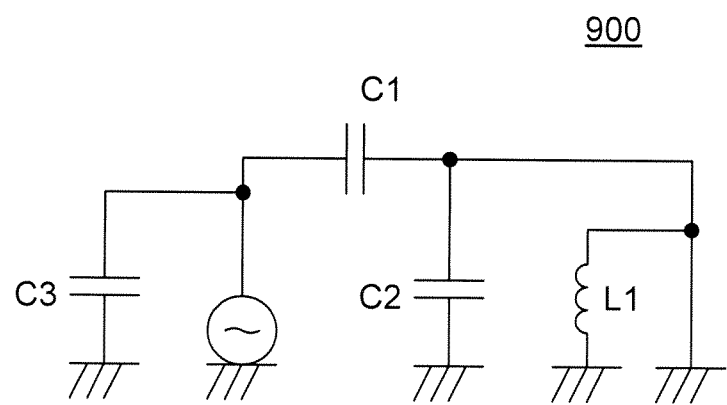
FIG. 24 is an equivalent circuit diagram of an antenna device 900 according to a sixteenth embodiment of the present invention.

FIG. 24 is an equivalent circuit diagram of an antenna device according to a sixteenth embodiment of the present invention.

As illustrated in FIG. 24, an antenna device 900 according to the present embodiment is featured in that a chip inductor is used as the frequency adjusting element 30. For example, when the capacitance C4 serving as the frequency adjusting element 30 is replaced with an inductance L1 in the configuration of the antenna device 100 illustrated in FIG. 1, the equivalent circuit of FIG. 24 can be realized.

Figure 25:
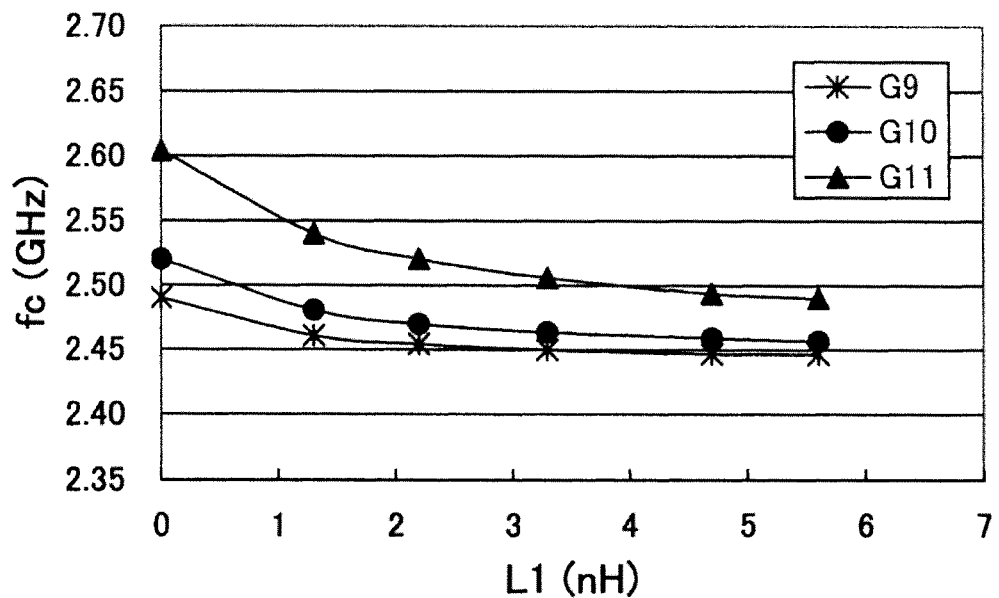
FIG. 25 is a graph representing frequency characteristics of the antenna device 900 according to a sixteenth embodiment of the present invention.

FIG. 25 is a graph representing frequency characteristics of the antenna device, in which curved lines G9 to G11 represent change rates of the resonance frequency fc obtained when the capacitance C4 serving as the frequency adjusting element 30 is replaced with the inductance L1 in the antenna device 100 of FIG. 1, antenna device 100A of FIG. 5, and antenna device 300A of FIG. 8.

As illustrated in FIG. 25, in the antenna device using the inductance L1, the higher the inductance L1, the lower the resonance frequency becomes, and the closer the frequency adjusting element 30 is to the antenna element 10, the higher the change rate of the resonance frequency fc becomes. For example, in the antenna device 100 (curved line G9), the resonance frequency fc does not change so much even if the inductance L1 is changed, whereas in the antenna device 300A (curved line G11), the resonance frequency fc significantly changes with a slight change in the inductance L1. As described above, it can be understood that the change rate of the resonance frequency fc significantly changes depending on the inductance of the frequency adjusting element 30.

Figure 26:
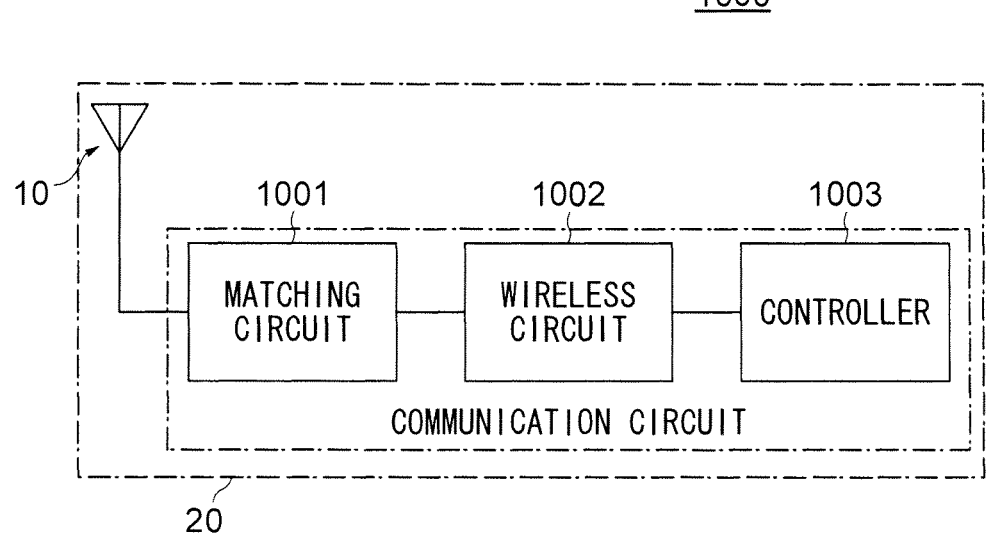
FIG. 26 is a block diagram illustrating an example of a configuration of a wireless communication device using the antenna device according to the present invention.

FIG. 26 is a block diagram illustrating an example of a configuration of a wireless communication device using the antenna device according to the present invention.

As illustrated in FIG. 26, a wireless communication device 1000 includes the antenna element 10, a matching circuit 1001 that adjusts an input impedance of the antenna element 10, a wireless circuit 1002 that outputs a wireless frequency signal, and a controller 1003 that controls the matching circuit 1001 and wireless circuit 1002. The matching circuit 1001, wireless circuit 1002, and controller 1003 constitute one communication circuit and mounted on the printed circuit board 20 together with the antenna element 10.

The present invention is in no way limited to the details of the described arrangements but changes and modifications may be made without departing from the scope of the appended claims.

For example, although the base 11 of the antenna element 10 has a rectangular solid shape in the above-described embodiments, the base 11 need not be formed into an accurate rectangular solid, but may be formed into a rough rectangular solid. It follows that the base 11 may include a partial cut portion, a through or non-through hole, or the like.

Further, although the ground clearance region 23a has a rectangular shape in the above-described embodiments, the region 23a need not be formed into an accurate rectangle, but may be formed into a rough rectangle. The ground pattern around the ground clearance region 23a may assume a complicated shape depending on a layout of various parts to be mounted on the printed circuit board 20. That is, the sides of the ground clearance region 23a need not each be a perfect straight line but may each have some irregularities.

Further, although the ground clearance region 23a is formed as a flat insulating region in the above-described embodiments, it is also effective to reduce a dielectric constant by forming a concave portion or a through hole in the ground clearance region 23a. This configuration may be combined with each of the above embodiments.

Further, although the terminal electrodes 14 to 16 are provided on the bottom surface 11b of the base 11 of the antenna element 10, and the antenna element 10 is solder-mounted on the lands 24 to 26 formed on the printed circuit board 20 in the above-describe embodiments, the present invention is not limited to such a configuration but the terminal electrodes 14 to 16 may be omitted. In this case, the electrode patterns sandwiched by the bottom surface of the base 11 of the antenna element 10 and printed circuit board include only the land patterns 14 to 16, and even in this configuration, the functions of the antenna device according to the present invention can be achieved. Note that fixation of the antenna element 10 can be achieved by using, e.g., an adhesive.

Description Of Reference Numerals 10 antenna element
11 base
11a upper surface of the base
11b bottom surface of the base
11c, 11d, 11e, 11f side surfaces of the base
12 upper surface conductor pattern
13 side surface conductor pattern
14, 15, 16 first terminal electrode
20 printed circuit board
20a front surface of the printed circuit board
20b rear surface of the printed circuit board
20e edge of the printed circuit board insulating substrate
22 ground pattern
22a, 22b, 22c edge line of the ground pattern
23a, 23b ground clearance region
24, 25, 26 land
27 antenna mounting region
28 power feeding line
29 impedance adjusting element
30 frequency adjusting element
31a linear wiring pattern
31b linear wiring pattern
100, 100A antenna device
200, 200A, 200B antenna device
300A, 300B antenna device
400A, 400B antenna device
500A, 500B, 500C, 500D antenna device
600 antenna device
700 antenna device
800 antenna device
900 antenna device
1000 wireless communication device
1001 matching circuit
1002 wireless circuit
1003 controller
C1 capacitance
L1 inductance

What is claimed is:
1. An antenna device comprising:
an antenna element; and
a printed circuit board on which the antenna element is mounted, wherein
the antenna element includes:
a base which is made of a dielectric material; and
a radiation conductor formed on at least one surface of the base, the printed circuit board includes:
a ground clearance region having substantially a rectangular shape and having one side contacting an edge of the printed circuit board and other three sides surrounded by an edge line of a ground pattern;
an antenna mounting region provided within the ground clearance region; and
at least one frequency adjusting element provided within the ground clearance region, and
the frequency adjusting element includes a chip capacitor or a chip inductor provided on the far side of the antenna mounting region as viewed from the edge of the printed circuit board,
the antenna device further includes first and second electrode patterns sandwiched between a bottom surface of the base and the printed circuit board,
the first electrode pattern is connected to the ground pattern, and
the second electrode pattern is connected to a power feeding line.

2. The antenna device as claimed in claim 1, wherein
the edge line of the ground pattern has a first edge line orthogonal to the edge of the printed circuit board, a second edge line opposed to the edge of the printed circuit board, and a third edge line opposed to the first edge line, and
a distance between the frequency adjusting element and second edge line is smaller than a distance between the frequency adjusting element and antenna mounting region.

3. The antenna device as claimed in claim 2, wherein the frequency adjusting element within the ground clearance region is provided on the near side of the first edge line or third edge line.

4. The antenna device as claimed in claim 2, wherein one end and the other end of the frequency adjusting element are each connected to any of the first to third edge lines.

5. The antenna device as claimed in claim 4, wherein
the one end of the frequency adjusting element is connected to the first edge line through a first wiring pattern, and
the other end of the frequency adjusting element is connected to the second edge line through a second wiring pattern.

6. The antenna device as claimed in claim 1, wherein the first and second electrode patterns are first and second terminal electrodes formed on the bottom surface of the base of the antenna element.

7. The antenna device as claimed in claim 6, wherein
the printed circuit board further includes first and second lands provided within the antenna mounting region in correspondence with the first and second terminal electrodes, respectively,
the first terminal electrode is connected to the ground pattern through the first lands, and
the second terminal electrode is connected to the power feeding line through the second lands.

8. The antenna device as claimed in claim 7, wherein
the antenna element further includes a third terminal electrode formed on the bottom surface of the base,
the printed circuit board further includes a third land provided within the antenna mounting region in correspondence with the third terminal electrode, and
the third terminal electrode is connected to the ground pattern through the third land.

9. The antenna device as claimed in claim 8, wherein at least one of the third terminal electrode and third land is formed into an L-shape having an open end facing the edge side of the printed circuit board.

10. The antenna device as claimed in claim 8, wherein the conductor patterns formed on the surfaces of the base of the antenna element has a symmetrical configuration with respect to a center line of the base extending in a longitudinal direction thereof.

11. A wireless communication device comprising:
a communication circuit; and
an antenna device connected to the communication circuit, wherein
the antenna device includes:
an antenna element; and
a printed circuit board on which the antenna element is mounted,
the antenna element includes:
a base which is made of a dielectric material; and
a radiation conductor formed on at least one surface of the base,
the printed circuit board includes:
a ground clearance region having substantially a rectangular shape and having one side contacting an edge of the printed circuit board and other three sides surrounded by an edge line of a ground pattern;
an antenna mounting region provided within the ground clearance region; and
at least one frequency adjusting element provided within the ground clearance region,
the frequency adjusting element includes a chip capacitor or a chip inductor provided on the far side of the antenna mounting region as viewed from the edge of the printed circuit board,
the antenna device further includes first and second electrode patterns sandwiched between a bottom surface of the base and the printed circuit board,
the first electrode pattern is connected to the ground pattern, and
the second electrode pattern is connected to a power feeding line.

* * * * *